US 9,553,024 B2

(12) United States Patent
Tokita

(10) Patent No.: US 9,553,024 B2
(45) Date of Patent: Jan. 24, 2017

(54) METHOD OF MANUFACTURING SEMICONDUCTOR DEVICE

(71) Applicant: RENESAS ELECTRONICS CORPORATION, Tokyo (JP)

(72) Inventor: Hirofumi Tokita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/091,370

(22) Filed: Apr. 5, 2016

(65) Prior Publication Data

US 2016/0315013 A1  Oct. 27, 2016

(30) Foreign Application Priority Data

Apr. 23, 2015  (JP) .................................. 2015-088278

(51) Int. Cl.
| H01L 21/8234 | (2006.01) |
| H01L 21/265 | (2006.01) |
| H01L 29/45 | (2006.01) |
| H01L 29/167 | (2006.01) |

(52) U.S. Cl.
CPC . *H01L 21/823418* (2013.01); *H01L 21/26513* (2013.01); *H01L 21/26586* (2013.01); *H01L 21/823462* (2013.01); *H01L 21/823468* (2013.01); *H01L 21/823493* (2013.01); *H01L 29/167* (2013.01); *H01L 29/45* (2013.01)

(58) Field of Classification Search
CPC combination set(s) only.
See application file for complete search history.

(56) References Cited

U.S. PATENT DOCUMENTS

| 5,217,910 A | 6/1993 | Shimizu et al. |
| 6,274,906 B1 | 8/2001 | Kim et al. |
| 2012/0319210 A1* | 12/2012 | Tsao .................. H01L 21/82381 257/392 |

(Continued)

FOREIGN PATENT DOCUMENTS

| JP | 2632101 B2 | 7/1997 |
| JP | H09-275149 A | 10/1997 |
| JP | H11-177083 A | 7/1999 |

*Primary Examiner* — Kyoung Lee
*Assistant Examiner* — Ratisha Mehta
(74) *Attorney, Agent, or Firm* — McDermott Will & Emery LLP

(57) ABSTRACT

Object is to provide a semiconductor device having improved reliability or performance.
A high-breakdown-voltage n type transistor has source and drain regions having first, second, and third semiconductor regions, which are formed by ion implantation of a first impurity from the outside of a high-breakdown-voltage gate electrode, a second impurity from the outside of the high-breakdown-voltage gate electrode and a first sidewall insulating film, and a third impurity from the outside of the high-breakdown-voltage gate electrode and the first and second sidewall insulating films, respectively. The first and second impurities are implanted from a direction tilted by 45° relative to the main surface of the semiconductor substrate and the third impurity from a direction perpendicular thereto. The impurity concentration of the first semiconductor region is lower than that of the second one and the ion implantation energy of the first impurity is greater than that of the second impurity.

15 Claims, 13 Drawing Sheets

(56) References Cited

U.S. PATENT DOCUMENTS

2013/0113035 A1* 5/2013 Kawashima ...... H01L 21/28282
  257/325
2015/0076566 A1* 3/2015 Kamino ............ H01L 27/14614
  257/229

* cited by examiner

METHOD OF MANUFACTURING SEMICONDUCTOR DEVICE

CROSS-REFERENCE TO RELATED APPLICATIONS

The disclosure of Japanese Patent Application No. 2015-088278 filed on Apr. 23, 2015 including the specification, drawings, and abstract is incorporated herein by reference in its entirety.

BACKGROUND

The present invention relates to a method of manufacturing a semiconductor device, for example, a technology effective when applied to a method of manufacturing a semiconductor device having a high-breakdown-voltage MISFET and a low-breakdown-voltage MISFET.

Japanese Patent No. 2632101 (Patent Document 1) and Japanese Unexamined Patent Application Publication No. Hei 11 (1999)-177083 (Patent Document 3) disclose a method of manufacturing a semiconductor device having, in source and drain regions of MOSFET thereof, a triple diffusion structure.

Japanese Unexamined Patent Application Publication No. Hei 9 (1997)-275149 (Patent Document 2) discloses a method of manufacturing a MOS transistor having an LDD structure using a double spacer or a thick spacer.

PATENT DOCUMENTS

[Patent Document 1] Japanese Patent No. 2632101
[Patent Document 2] Japanese Unexamined Patent Application Publication No. Hei 9 (1997)-275149
[Patent Document 3] Japanese Unexamined Patent Application Publication No. Hei 11 (1999)-177083

SUMMARY

A semiconductor device investigated by the present inventors has a high-breakdown-voltage MISFET and the high-breakdown-voltage MISFET is formed as described below.

For example, the high-breakdown-voltage MISFET is in an active region defined by an element isolation region formed in a p well region and it has a gate electrode, a source region, and a drain region. The gate electrode has, on the side wall thereof, a sidewall insulating film. The n type source region and drain region each have an n type lightly doped semiconductor region and an n type heavily doped semiconductor region. The lightly doped semiconductor region is formed in the active region by ion implantation with the gate electrode as a mask, while the heavily doped semiconductor region is formed in the active region by ion implantation with the gate electrode and the sidewall insulating film as a mask. In a plan view, therefore, the heavily doped semiconductor region has therearound the lightly doped semiconductor region and the element isolation region. In a cross-sectional view, on the other hand, the lightly doped semiconductor region has a depth greater than that of the heavily doped semiconductor region and it extends to below the gate electrode.

Miniaturization of a semiconductor device requires not only downsizing of a high-breakdown-voltage MISFET but also narrowing of the width of an element isolation region. For narrowing of the width of an element isolation region, the depth of the element isolation region should be reduced.

The element isolation region is formed using STI (shallow trench isolation), which is a method of filling a trench formed in the surface of a semiconductor substrate with an insulating film. The trench can be filled more easily when a ratio (aspect ratio) of the depth of the trench is smaller than the width of the trench. When the aspect ratio is large, on the other hand, the insulating film cannot be filled fully and the insulation of the element isolation region cannot be retained, which may cause a leakage current between active regions adjacent to each other. The depth of the element isolation region should therefore be reduced because of the above-described reason.

The investigation by the present inventors has, however, revealed that it leads to the problem of a breakdown voltage reduction between the source or drain region of the high-breakdown-voltage MISFET and a well region. The well region has an impurity distribution which increases gradually in the depth direction. The impurity concentration becomes the highest in the vicinity of the bottom portion of the element isolation region. As the element isolation region becomes shallow, a portion of the well region having the highest impurity concentration becomes close to the source region or drain region of the high-breakdown-voltage MISFET. This decreases a distance between the lightly-doped and heavily-doped semiconductor regions constituting the source region or drain region and the highly-doped portion in the well region, leading to a reduction in breakdown voltage.

A semiconductor device with a high-breakdown-voltage MISFET is therefore desired to have improved reliability, or have improved performance, or have both improved reliability and performance.

Another object and novel feature will be apparent from the description herein and accompanying drawings.

According to one embodiment, the source region or drain region of a high-breakdown-voltage n type transistor is comprised of first, second, and third semiconductor regions. The first semiconductor region is formed by ion implantation of a first impurity from the outside of a gate electrode, the second semiconductor region is formed by ion implantation of a second impurity from the outside of the gate electrode and a first sidewall insulating film, and the third semiconductor region is formed by ion implantation of a third impurity from the outside of the gate electrode, the first sidewall insulating film, and a second sidewall insulating film. The first impurity and the second impurity are implanted from a direction tilted by 45 degrees with respect to the main surface of the semiconductor substrate. The third impurity is implanted from a direction perpendicular to the main surface of the semiconductor substrate. The impurity concentration of the first semiconductor region is lower than that of the second semiconductor region and the ion implantation energy of the first impurity is greater than that of the second impurity.

According to the one embodiment, a semiconductor device can have improved reliability, improved performance, or both improved reliability and performance.

DETAILED DESCRIPTION

Figure 1:
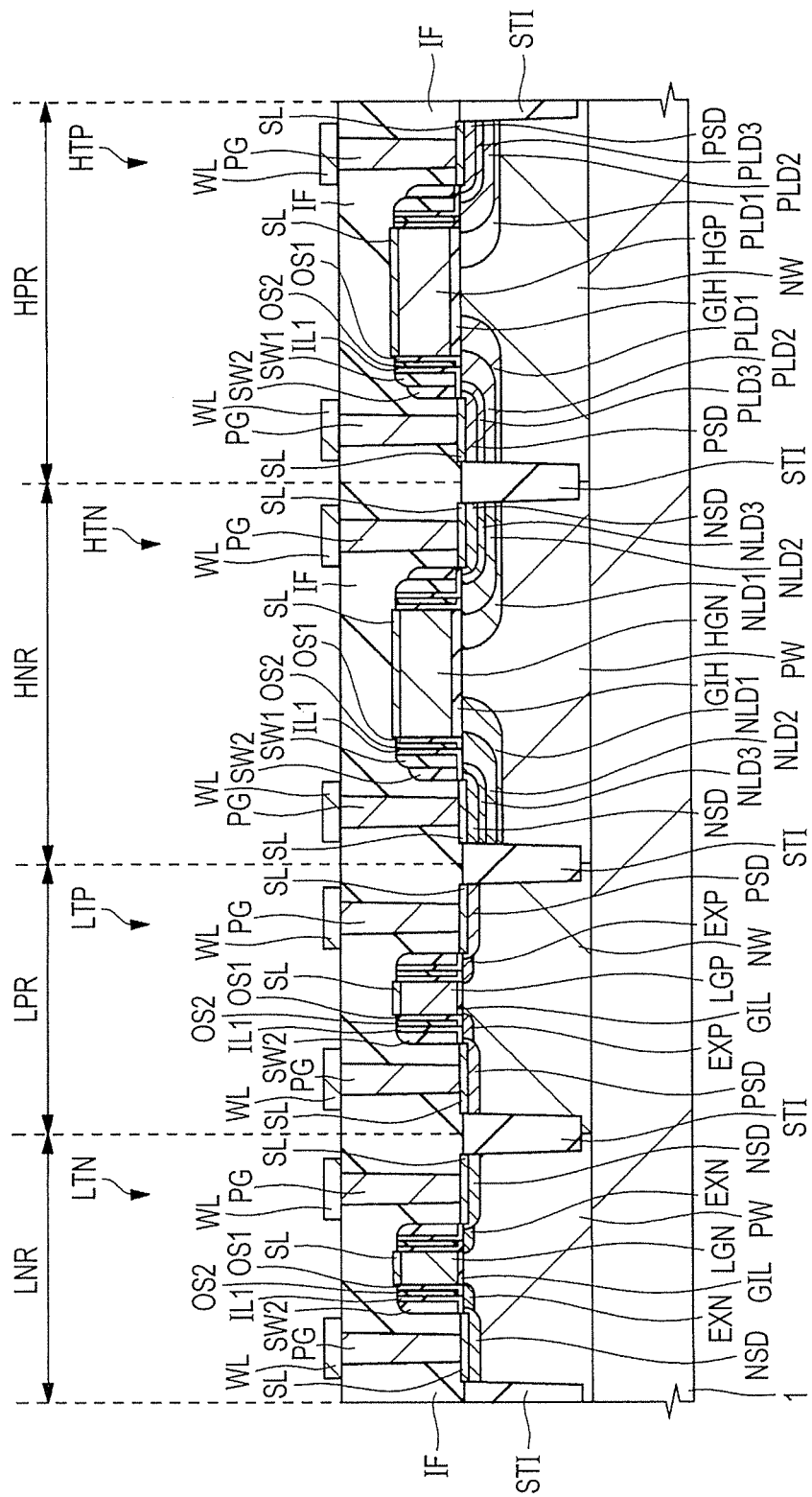
FIG. 1 is a fragmentary cross-sectional view of a semiconductor device of Embodiment.

In the following embodiment, a description will be made after divided into a plurality of sections or embodiments if necessary for the sake of convenience. These sections or embodiments are not independent from each other unless otherwise particularly specified, but one of them may be a modification example, details, complementary description, or the like of a part or whole of the other one.

In the following embodiment, when a reference is made to the number (including the number, value, amount, range, or the like) of a component, the number is not limited to a specific number but may be more or less than the specific number, unless otherwise particularly specified or principally apparent that the number is limited to the specific number.

Further, in the following embodiment, it is needless to say that the constituent component (including component step or the like) is not always essential unless otherwise particularly specified or principally apparent that it is essential.

Similarly, in the following embodiment, when a reference is made to the shape, positional relationship, or the like of the constituent component, that substantially approximate or analogous to it is also embraced unless otherwise particularly specified or principally apparent that it is not. This also applies to the above-mentioned value, range, or the like.

In all the drawings for describing the embodiment, same members will be identified by the same reference numerals and overlapping descriptions will be omitted.

Embodiment

Structure of Semiconductor Device

FIG. 1 is a fragmentary cross-sectional view of a semiconductor device of the present embodiment. The semiconductor device has a low-breakdown-voltage n type transistor LTN, a low-breakdown-voltage p type transistor LTP, a high-breakdown-voltage n type transistor HTN, and a high-breakdown-voltage p type transistor HTP. The operating supply voltage of the low-breakdown-voltage n type transistor LTN and the low-breakdown-voltage p type transistor LTP is, for example, 1V or less and the operating supply voltage of the high-breakdown-voltage n type transistor HTN and the high-breakdown-voltage p type transistor HTP is, for example, 10V or more. The operating supply voltage of the high-breakdown-voltage n type transistor HTN and the high-breakdown-voltage p type transistor HTP is higher than that of the low-breakdown-voltage n type transistor LTN and the low-breakdown-voltage p type transistor LTP. These transistors are each, for example, a MISFET (metal insulator semiconductor field effect transistor).

The semiconductor device is present on a p type semiconductor substrate 1 made of, for example, silicon. The semiconductor substrate 1 has, in the main surface thereof, a plurality of p well regions PW and a plurality of n well regions NW. The p well regions PW and the n well regions NW have a desired depth (for example, from 0.3 μm to 0.4 μm) from the main surface of the semiconductor substrate 1 in a depth direction of the semiconductor substrate 1. The low-breakdown-voltage n type transistor LTN and the high-breakdown-voltage n type transistor HTN are in the p well region PW, while the low-breakdown-voltage p type transistor LTP and the high-breakdown-voltage p type transistor HTP are in the n well region NW.

The semiconductor substrate 1 has, in the main surface thereof, an element isolation region STI made of an insulating film (insulating material). An active region, which is a portion of the main surface of the semiconductor substrate 1, is surrounded by the element isolation region STI. The semiconductor substrate 1 has, in the main surface thereof, a plurality of active regions each surrounded by the element isolation region STI. The active region is a region where the above-described transistor is formed and two transistors adjacent to each other are electrically isolated by the element isolation region. The element isolation region STI has a depth of from about 0.25 to 0.30 μm from the main surface of the semiconductor substrate 1 and it is, in plan view, inside the p well region PW, inside the n well region NW, and at a boundary portion between the p well region PW and the n well region NW. The element isolation region STI is shallower than the p well region PW and the n well region NW so that the p well region PW and the n well region NW have therein a plurality of active regions surrounded by the element isolation region STI, though not shown in the drawings. The p well region PW and the n well region NW have an impurity profile in which an impurity concentration increases from the main surface of the semiconductor substrate 1 to the inside thereof. The impurity concentration becomes highest at the bottom portion of the element isolation region STI.

The low-breakdown-voltage n type transistor LTN formed in an LN region LNR has a low-breakdown-voltage gate electrode LGN formed on the main surface of the semiconductor substrate 1 via a low-breakdown-voltage gate insulating film GIL and source and drain regions formed in the main surface (in other words, in the p well region PW) of the semiconductor substrate 1 on both sides of the low-breakdown-voltage gate electrode LGN. The source and drain regions are each comprised of an n type semiconductor region EXN and an n type semiconductor region NSD. The impurity concentration of the semiconductor region EXN is lower than that of the semiconductor region NSD and the depth of the semiconductor region EXN is smaller than that of the semiconductor region NSD. The semiconductor region EXN is located between the semiconductor region NSD and the low-breakdown-voltage gate electrode LGN and it overlaps partially with the low-breakdown-voltage gate electrode LGN. This means that the semiconductor region EXN extends to below the low-breakdown-voltage gate electrode LGN. The surface of the p well region PW between the source and drain regions becomes a channel formation region. A region between the semiconductor regions EXN of the source and drain regions may be defined as the channel formation region.

The low-breakdown-voltage gate electrode LGN has, on the both side walls thereof, an offset spacer OS1, an offset spacer OS2, an insulating film IL1, and a sidewall insulating film SW2 in order of mention. The end portion of the semiconductor region EXN on the side of the channel formation region overlaps with the low-breakdown-voltage gate electrode LGN and extends to below the bottom side of the low-breakdown-voltage gate electrode LGN. The end portion of the semiconductor region NSD on the side of the channel formation region is located outside the low-breakdown-voltage gate electrode LGN and does not overlap with the low-breakdown-voltage gate electrode LG. The end portion of the semiconductor region EXN on the side of the channel formation region is separated from the end portion of the semiconductor region NSD on the side of the channel formation region by a distance corresponding to the sum of the thicknesses of the offset spacer OS1, the offset spacer OS2, the insulating film IL1, and the sidewall insulating film SW2 (thickness in a direction perpendicular to the side wall of the low-breakdown-voltage gate electrode LG). The end portion of the semiconductor region NSD on the side of the channel formation region overlaps with the sidewall insulating film SW2 and extends to below the bottom side of the sidewall insulating film SW2.

In plan view, a silicide layer SL is present in the source and drain regions so as to cover a portion of the semiconductor region NSD exposed from the sidewall insulating film SW2 and the element isolation region STI. The silicide layer SL is also present on the upper surface of the low-breakdown-voltage gate electrode LGN.

The low-breakdown-voltage n type transistor LTN is covered with the interlayer insulating film IF and a plurality of openings formed in the interlayer insulating film IF exposes a portion of the silicide layer SL formed on the source and drain regions. A plug electrode PG made of a metal film formed in the openings is contiguous to the silicide layer SL formed on the source and drain regions. The interlayer insulating film IF has thereon a plurality of wirings WL each contiguous to the plug electrode PG. This means that the wirings WL have an electrical coupling to the source and drain regions via the plug electrodes PG.

The low-breakdown-voltage p type transistor LTP formed in the LP region LPR has a low-breakdown-voltage gate electrode LGP formed on the main surface of the semiconductor substrate 1 via a low-breakdown-voltage gate insulating film GIL and source and drain regions formed in the main surface (in other words, in the n well region NW) of the semiconductor substrate 1 on both sides of the low-breakdown-voltage gate electrode LGP. The source and drain regions are each comprised of a p type semiconductor region EXP and a p type semiconductor region PSD. The impurity concentration of the semiconductor region EXP is lower than that of the semiconductor region PSD and the depth of the semiconductor region EXP is smaller than that of the semiconductor region PSD. The semiconductor region EXP is located between the semiconductor region PSD and the low-breakdown-voltage gate electrode LGP and partially overlaps with the low-breakdown-voltage gate electrode LGP. In short, the semiconductor region EXP extends to below the low-breakdown-voltage gate electrode LGP. The surface of the n well region NW between the source and drain regions becomes a channel formation region. A region between the semiconductor regions EXP of the source and drain regions may be defined as the channel formation region.

The low-breakdown-voltage gate electrode LGP has, on the both side walls thereof, an offset spacer OS1, an offset spacer OS2, an insulating film IL1, and a sidewall insulating film SW2 in order of mention. The end portion of the semiconductor region EXP on the side of the channel formation region overlaps with the low-breakdown-voltage gate electrode LGP and extends to below the low-breakdown-voltage gate electrode LGP, but the end portion of the semiconductor region PSD on the side of the channel formation region does not overlap with the low-breakdown-voltage gate electrode LGP. The end portion of the semiconductor region EXP on the side of the channel formation region is separated from the end portion of the semiconductor region PSD on the side of the channel formation region by a distance corresponding to the sum of the thicknesses of the offset spacer OS1, the offset spacer OS2, the insulating film IL1, and the sidewall insulating film SW2 (thicknesses in a direction perpendicular to the side wall of the low-breakdown-voltage gate electrode LGP). The end portion of the semiconductor region PSD on the side of the channel formation region overlaps with the sidewall insulating film SW2 and extends to below the sidewall insulating film SW2.

In plan view, a silicide layer SL is present in the source and drain regions so as to cover a portion of the semiconductor region PSD exposed from the sidewall insulating film SW2 and the element isolation region STI. The silicide layer SL is also present on the upper surface of the low-breakdown-voltage gate electrode LGP.

The low-breakdown-voltage n type transistor LTP is covered with the interlayer insulating film IF and a plurality of openings formed in the interlayer insulating film IF exposes a portion of the silicide layer SL formed on the source and drain regions. A plug electrode PG made of a metal film formed in the openings is contiguous to the silicide layer SL formed on the source and drain regions. The interlayer insulating film IF has thereon a plurality of wirings WL each contiguous to the plug electrode PG. This means that the wirings WL have an electrical coupling to the source and drain regions via the plug electrodes PG.

The high-breakdown-voltage n type transistor HTN formed in the HN region HNR has a high-breakdown-voltage gate electrode HGN formed on the main surface of the semiconductor substrate 1 via a high-breakdown-voltage gate insulating film GIH and source and drain regions formed in the main surface (in other words, the p well region PW) of the semiconductor substrate 1 on both sides of the high-breakdown-voltage gate electrode HGN. The source and drain regions are each comprised of n type semiconductor regions NLD1, NLD2, and NLD3 and an n type semiconductor region NSD. The impurity concentration of the semiconductor region NSD is higher than that of the semiconductor regions NLD1, NLD2, and NLD3 and the depth of the semiconductor region NDS is smaller than that of the semiconductor regions NLD1, NLD2, and NLD3. The impurity concentration of the semiconductor regions NLD1, NLD2, and NLD3 is higher in the order of the semiconductor region NLD1, the semiconductor region NLD2, and the semiconductor region NLD3. The depth of the semiconductor regions NLD1, NLD2, and NLD3 is smaller in the order of the semiconductor region NLD1, the semiconductor region NLD2, and the semiconductor region NLD3. The surface of the p well region PW between the source and drain regions becomes a channel formation region. The semiconductor region NLD1, the semiconductor region NLD2, the semiconductor region NLD3, and the semiconductor region NSD are present in order of mention in a direction separating from the channel formation region. In other words, the source and drain regions are each comprised of the semiconductor region NLD1 located on the outermost side, the semiconductor region NLD2 enclosed in the semiconductor region NLD1, the semiconductor region NLD3 enclosed in the semiconductor region NLD2, and the semiconductor region NSD enclosed in the semiconductor region NLD3. The semiconductor region NLD1 is contiguous to the p well region PW and they form a PN junction.

The high-breakdown-voltage gate electrode HGN has, on the both side walls thereof, an offset spacer OS1, an offset spacer OS2, an insulating film IL1, a sidewall insulating film SW1, and a sidewall insulating film SW2 in order of mention. The semiconductor regions NLD1 and NLD2 overlap, at the end portion thereof on the side of the channel formation region, with the high-breakdown-voltage gate electrode HGN and extend to below the high-breakdown-voltage gate electrode HGN, but the semiconductor regions NLD3 and NLD do not overlap, at the end portion thereof on the side of the channel formation region, with the high-breakdown-voltage gate electrode HGN. The semiconductor region NLD3 overlaps with the sidewall insulating film SW1 and extends to below the sidewall insulating film SW1, while the semiconductor region NSD overlaps with the sidewall insulating film SW2 and extends to below the sidewall insulating film SW2.

In plan view, a silicide layer SL is present in the source and drain regions so as to covers a portion of the semiconductor region NSD exposed from the sidewall insulating film SW2 and the element isolation region STI. The silicide layer SL also covers the upper surface of the high-breakdown-voltage gate electrode HGN.

The high-breakdown-voltage n type transistor HTN is covered with the interlayer insulating film IF. A plurality of openings formed in the interlayer insulating film IF exposes a portion of the silicide layer SL formed on the source and drain regions. A plug electrode PG made of a metal film formed in the openings is contiguous to the silicide layer SL formed on the source and drain regions. The interlayer insulating film IF has thereon a plurality of wirings WL each contiguous to the plug electrode PG. This means that the wirings WL have an electrical coupling to the source and drain regions via the plug electrodes PG.

The high-breakdown-voltage p type transistor HTP formed in the HP region HPR has a high-breakdown-voltage gate electrode HGP formed on the main surface of the semiconductor substrate 1 via a high-breakdown-voltage gate insulting film GIH and source and drain regions formed in the main surface (in other words, the n well region NW) of the semiconductor substrate 1 on both sides of the high-breakdown-voltage gate electrode HGP. The source and drain regions are each comprised of p type semiconductor regions PLD1, PLD2, and PLD3 and an n type semiconductor region PSD. The impurity concentration of the semiconductor region PSD is higher than that of the semiconductor regions PLD1, PLD2, and PLD3 and the depth of the semiconductor region PSD is smaller than that of the semiconductor regions PLD1, PLD2, and PLD3. The impurity concentration of the semiconductor regions PLD1, PLD2, and PLD3 is higher in the order of the semiconductor region PLD1, the semiconductor region PLD2, and the semiconductor region PLD3. The depth of the semiconductor regions PLD1, PLD2, and PLD3 is smaller in the order of the semiconductor region PLD1, the semiconductor region PLD2, and the semiconductor region PLD3. The surface of the n well region NW between the source and drain regions becomes a channel formation region. The semiconductor region PLD1, the semiconductor region PLD2, the semiconductor region PLD3, and the semiconductor region PSD are present in order of mention in a direction separating from the channel formation region. In other words, the source and drain regions are each comprised of the semiconductor region PLD1 located on the outermost side, the semiconductor region PLD2 enclosed in the semiconductor region PLD1, the semiconductor region PLD3 enclosed in the semiconductor region PLD2, and the semiconductor region PSD enclosed in the semiconductor region PLD3. The semiconductor region PLD1 is contiguous to the n well region NW and they form a PN junction.

The high-breakdown-voltage gate electrode HGP has, on the both side walls thereof, an offset spacer OS1, an offset spacer OS2, an insulating film ILL a sidewall insulating film SW1, and a sidewall insulating film SW2 in order of mention. The semiconductor regions PLD1 and PLD2 overlap, at the end portion thereof on the side of the channel formation region, with the high-breakdown-voltage gate electrode HGP and extend to below the high-breakdown-voltage gate electrode HGP, but the semiconductor regions PLD3 and PSD do not overlap, at the end portion thereof on the side of the channel formation region, with the high-breakdown-voltage gate electrode HGP. The semiconductor region PLD3 overlaps with the sidewall insulating film SW1 and extends to below the sidewall insulating film SW1, while the semiconductor region PSD overlaps with the sidewall insulating film SW2 and extends to below the sidewall insulating film SW2.

In plan view, a silicide layer SL is present in the source and drain regions so as to cover a portion of the semiconductor region PSD exposed from the sidewall insulating film SW2 and the element isolation region STI. The silicide layer SL also covers the upper surface of the high-breakdown-voltage gate electrode HGP.

The high-breakdown-voltage p type transistor HTP is covered with the interlayer insulating film IF. A plurality of openings formed in the interlayer insulating film IF exposes a portion of the silicide layer SL formed on the source and drain regions. A plug electrode PG made of a metal film formed in the openings is contiguous to the silicide layer SL formed on the source and drain regions. The interlayer insulating film IF has thereon a plurality of wirings WL each contiguous to the plug electrode PG. This means that the wirings WL have an electrical coupling to the source and drain regions via the plug electrodes PG.

In FIG. 1, the gate length (for example, length of a gate electrode in a direction from the source region to the drain region) of the high-breakdown-voltage gate electrodes HGN and HGP is longer than the gate length of the low-breakdown-voltage gate electrodes LGN and LGP. The thickness of the high-breakdown-voltage gate insulating film GIH is thicker than that of the low-breakdown-voltage gate insulating film GIL.

The impurity concentration of the semiconductor region NLD1 of the high-breakdown-voltage n type transistor HTN is lower than that of the semiconductor region EXN of the low-breakdown-voltage n type transistor LTN. Further, the impurity concentration of the semiconductor region NLD2 of the high-breakdown-voltage n type transistor HTN is lower than that of the semiconductor region EXN of the low-breakdown-voltage n type transistor LTN.

The impurity concentration of the semiconductor region PLD1 of the high-breakdown-voltage p type transistor HTP is lower than that of the semiconductor region EXP of the low-breakdown-voltage p type transistor LTP. Further, the impurity concentration of the semiconductor region PLD2 of the high-breakdown-voltage p type transistor HTP is lower than that of the semiconductor region EXP of the low-breakdown-voltage p type transistor LTP.

<Method of Manufacturing Semiconductor Device>

The semiconductor device of the present embodiment has a constitution as described above and a manufacturing method of it will next be described referring to some drawings.

FIGS. 2 to 13 are fragmentary cross-sectional views of the semiconductor device of the present embodiment during manufacturing steps thereof.

Figure 2:
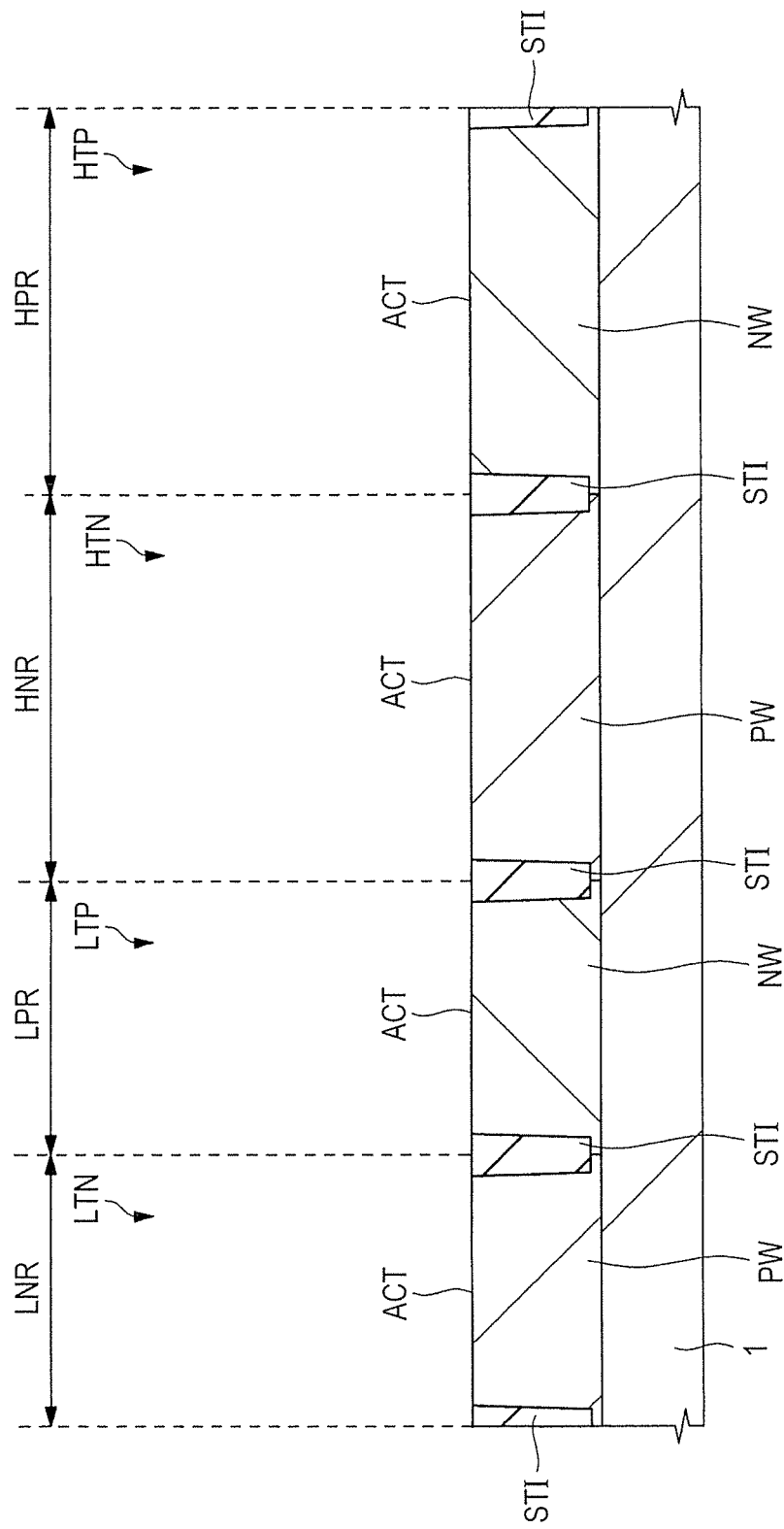
FIG. 2 is a fragmentary cross-sectional view of the semiconductor device of Embodiment during a manufacturing step thereof.

As shown in FIG. 2, provided is a semiconductor substrate 1 having an LN region LNR which is a formation region of a low-breakdown-voltage n type transistor LTN, an LP region LPR which is a formation region of a low-breakdown-voltage p type transistor LTP, an HN region HNR which is a formation region of a high-breakdown-voltage n type transistor HTN, and a HP region HPR which is a formation region of a high-breakdown-voltage p type transistor HTP. The LN region LNR, LP region LPR, HN region HNR, and HP region HPR are each comprised of an active region ACT and an element isolation region STI surrounding the active region ACT. The active region ACT and the element isolation region STI are placed so that the active region seems like an "island" and the element isolation region STI seems like a "sea" surrounding the "island." This means that two adjacent active regions are electrically isolated from each other by the element isolation region STI. The element isolation region STI is formed by filling a trench formed in the main surface of the semiconductor substrate 1 with an insulating film such as silicon oxide film and the element isolation region STI has a depth of from about 0.25 to 0.30 μm from the main surface of the semiconductor substrate 1.

The active region ACT of the LN region LNR and the HN region HNR has a p well region PW and that of the LP region LPR and the HP region HPR has the n well region NW. The p well region PW and the n well region NW are deeper than the element isolation region STI and the p well region PW and the n well region NW have their boundary below the element isolation region STI. The p well region P is formed, for example, by three-stage ion implantation of an impurity such as boron (B). Described specifically, it is formed by first-stage ion implantation at a high concentration and a high energy, second-stage ion implantation at a medium concentration and a medium energy, and third-stage implantation at a low concentration and a low energy. The p well region PW has an impurity concentration profile that has a peak at the depth corresponding to the bottom portion of the element isolation region STI, from which the concentration decreases toward the main surface of the semiconductor substrate 1. The n well region NW is formed in a manner similar to that of the p well region PW by using, for example, an impurity such as phosphorus (P) so that it has an impurity concentration profile in which the impurity concentration increases in the depth direction from the main surface side of the semiconductor substrate 1. The p well region PW of the LN region LNR and the HN region HNR may be formed by respectively different steps at respectively different impurity concentrations and respectively different implantation energies. The n well region of the LP region LPR and the HP region HPR may also be formed by respectively different steps at respectively different impurity concentrations and at respectively different implantation energies. They have however a common impurity concentration profile that increases toward the depth direction from the main surface side of the semiconductor substrate.

Figure 3:
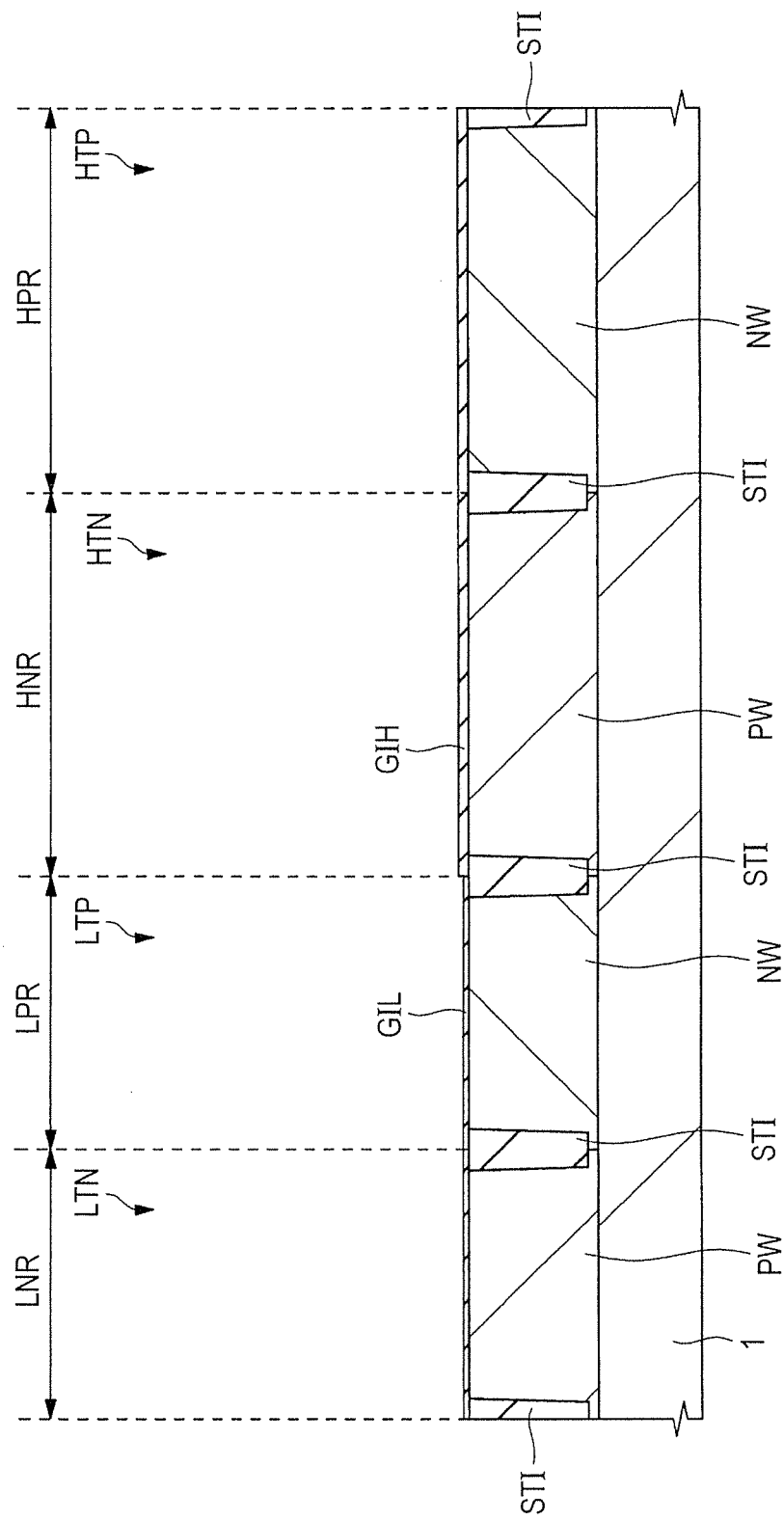
FIG. 3 is a fragmentary cross-sectional view of the semiconductor device during a manufacturing step following that of FIG. 2.

Next, as shown in FIG. 3, a high-breakdown-voltage gate insulating film (gate insulating film) GIH and a low-breakdown-voltage gate insulating film (gate insulating film) GIL are formed on the main surface of the semiconductor substrate 1. The high-breakdown-voltage gate insulating film GIH and the low-breakdown-voltage gate insulating film GIL are each comprised of a silicon oxide film, a silicon oxynitride film, a silicon nitride film, or a High-k insulating film, or a stacked film of them. For example, the high-breakdown-voltage gate insulating film GI has a thickness greater than that of the low-breakdown-voltage gate insulating film GIL. When they are made of different kinds of films, their film thicknesses are compared in terms of the thickness of a silicon oxide film. For example, the high-breakdown-voltage gate insulating film GIH and the low-breakdown-voltage gate insulating film GIL are made of silicon oxynitride films about 15 nm thick and about 1 nm thick, respectively.

Figure 4:
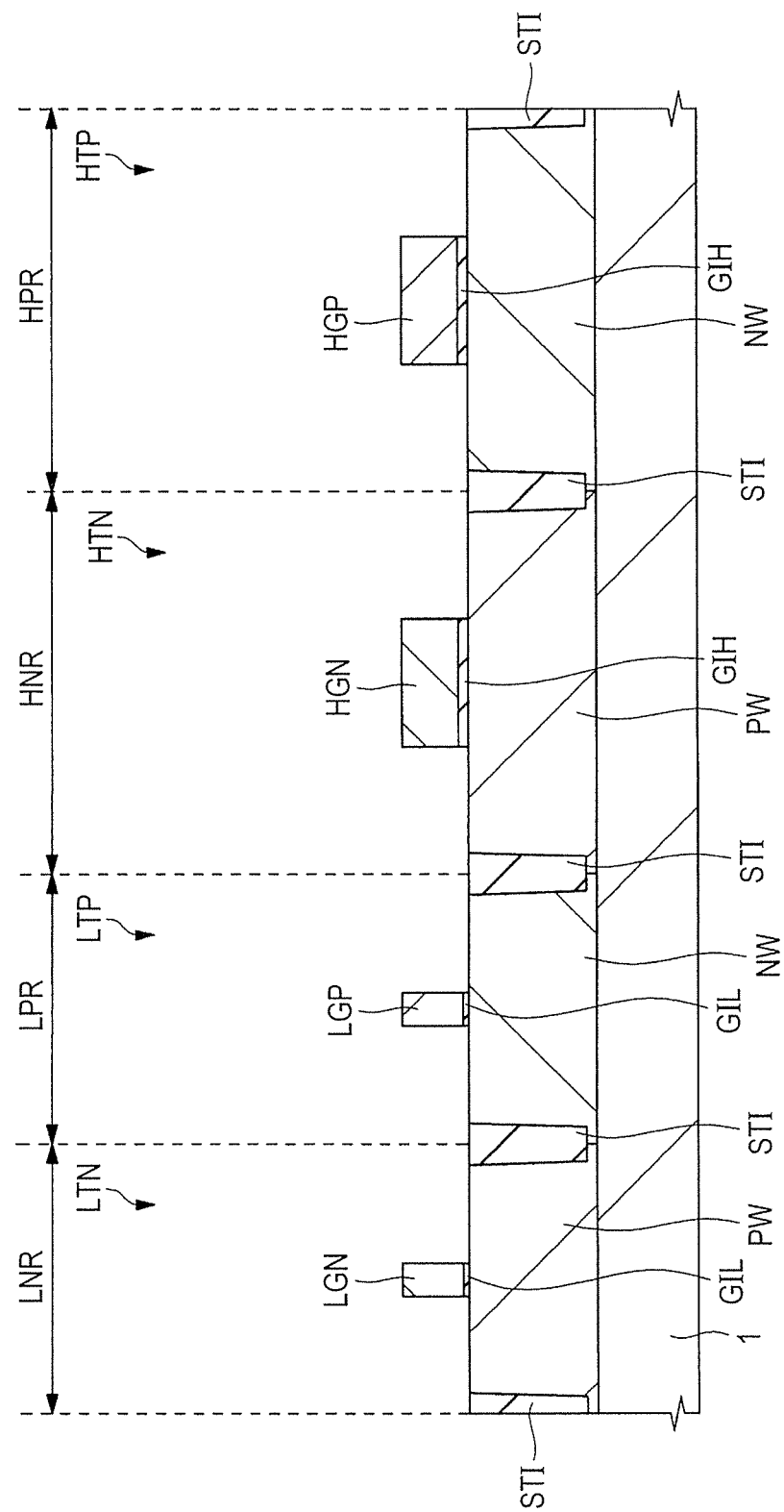
FIG. 4 is a fragmentary cross-sectional view of the semiconductor device during a manufacturing step following that of FIG. 3.

Next, as shown in FIG. 4, an n type low-breakdown-voltage gate electrode LGN, a p type low-breakdown-voltage gate electrode LGP, an n type high-breakdown-voltage gate electrode HG, and a p type high-breakdown-voltage gate electrode HGP are formed in the LN region LNR, the LP region LPR, the HN region HNR, and the HP region HPR, respectively.

After deposition of a silicon film (polysilicon film) about 100 nm thick on the high-breakdown-voltage gate insulating film GIH and the low-breakdown-voltage gate insulating film GIL, an n type impurity (for example, phosphorus) is introduced into the silicon film in the LN region LNR and the HN region HNR to convert it into an n type silicon film. A p type impurity (for example, boron) is introduced into the silicon film in the LP region LPR and the HP region HPR to convert it into a p type silicon film.

Next, photography and etching are used to pattern the silicon films to form an n type low-breakdown-voltage gate electrode LGN, a p type low-breakdown-voltage gate electrode LGP, an n type high-breakdown-voltage gate electrode HGN, and a p type high-breakdown-voltage gate electrode HGP. During this process, the low-breakdown-voltage gate insulating film GIL lying below the silicon film is also patterned to have a planar shape equal to that of the gate electrode thereon. In addition, the high-breakdown-voltage gate insulating film GIH lying below the silicon film is partially patterned at the upper surface near the gate electrode.

This means that the LN region LNR has, on the main surface of the semiconductor substrate 1, a stacked structure of the patterned low-breakdown-voltage gate insulating film GIL and the low-breakdown-voltage gate electrode LGN, while the LP region LPR has, on the main surface of the semiconductor substrate 1, a stacked structure of the patterned low-breakdown-voltage insulating film GIL and the low-breakdown-voltage gate electrode LGP. The HN region HNR has, on the main surface of the semiconductor substrate 1, a stacked structure of the high-breakdown-voltage gate electrode HGN and the partially patterned high-breakdown-voltage gate insulating film GIH, while the HP region HPR has, on the main surface of the semiconductor substrate 1, a stacked structure of the high-breakdown-voltage gate electrode HGP and the partially patterned high-breakdown-voltage gate insulating film GIH. In FIG. 4, to simplify the drawing, the high-breakdown-voltage gate insulating film is completely patterned to have a planar shape equal to that of the gate electrode thereon.

Figure 5:
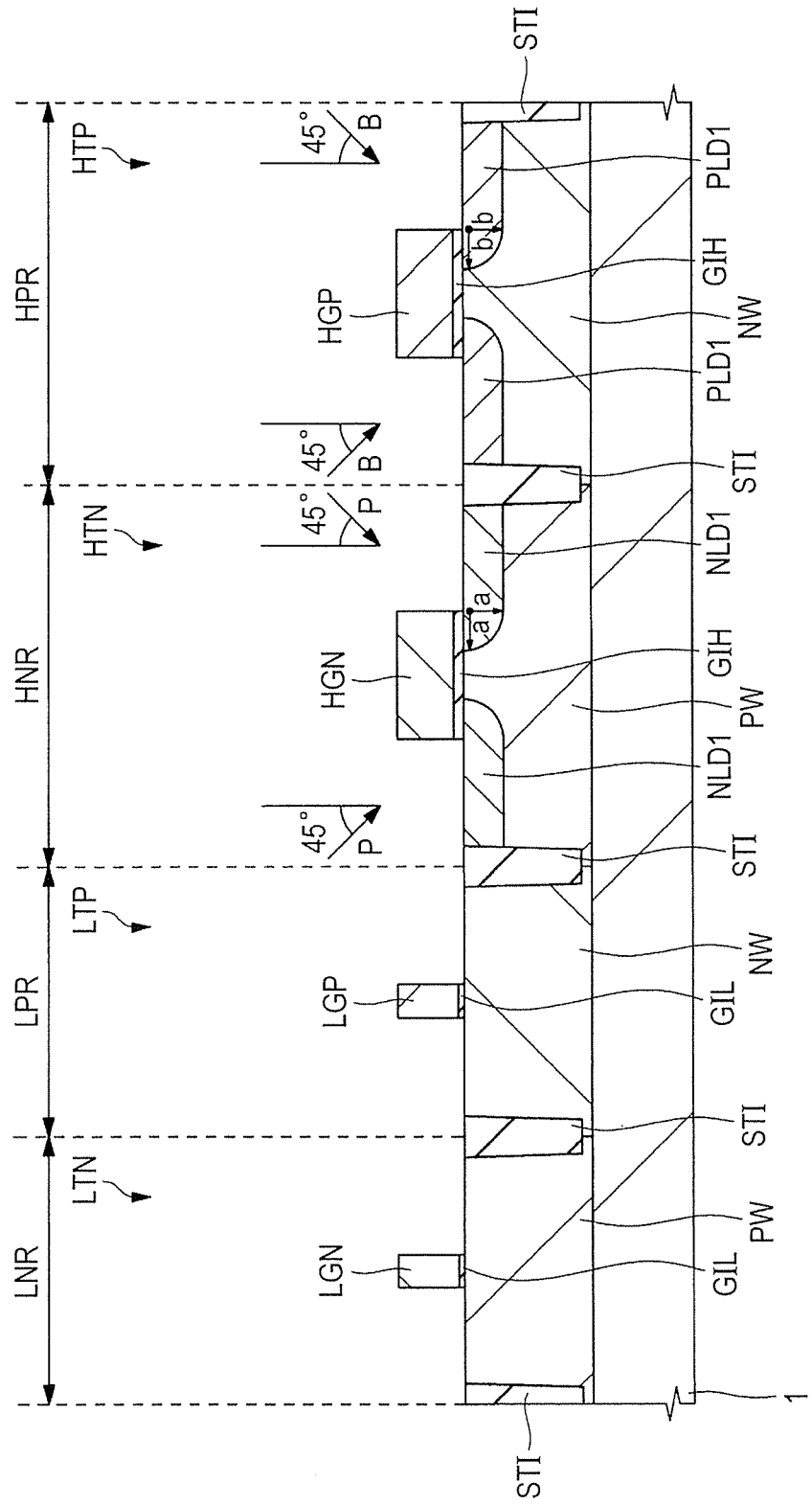
FIG. 5 is a fragmentary cross-sectional view of the semiconductor device during a manufacturing step following that of FIG. 4.

Next, as shown in FIG. 5, in the HN region HNR, a semiconductor region (lightly doped semiconductor region) NLD1 is formed in the p well region PW at both ends of the high-breakdown-voltage gate electrode HGN. In the HP region HPR, then, a semiconductor region (lightly doped semiconductor region) PLD1 is formed in the n well region NW at both ends of the high-breakdown-voltage gate electrode HGP. The semiconductor region (lightly doped semiconductor region) NLD1 and the semiconductor region (lightly doped semiconductor region) PLD1 may be formed by reversing the order.

The semiconductor region NLD1 is formed by introducing phosphorus (P), an n type impurity, into the main surface of the semiconductor substrate 1 by ion implantation from a direction tilted by about 45° with respect to a direction perpendicular thereto (in other words, a direction tilted by 45° with respect to the main surface of the semiconductor substrate 1). The impurity is implanted at an implantation amount (dose) of, for example, $5 \times 10^{12}/cm^2$ and an implantation energy of about 90 KeV. During implantation, the high-breakdown-voltage gate electrode HGN functions as an ion implantation mask and the n type impurity is implanted into the semiconductor substrate 1 (in other words, the p well region PW) from the outside of the high-breakdown-voltage gate electrode HGN. The n type impurity thus implanted is subjected to activation annealing. After annealing, the semiconductor region (lightly doped semiconductor region) NLD1 extends to below the high-breakdown-voltage gate electrode HGN by a distance (a) from the end portion of the high-breakdown-voltage gate electrode HGN and extends in a direction deeper by the distance (a) from the main surface of the semiconductor substrate 1 at the end portion of the high-breakdown-voltage gate electrode HGN. The extending width (a) to below the high-breakdown-voltage gate electrode HGN and the extending width (a) to the depth direction, each in the semiconductor region (lightly doped semiconductor region) NLD1, can be made equal to each other by ion implantation of the n type impurity from a direction tilted by about 45° with respect to a direction perpendicular to the main surface of the semiconductor substrate 1. Compared with ion implantation of the n type impurity perpendicularly to the main surface of the semiconductor substrate 1, the above-described ion implantation makes it possible to increase the extending width to below the high-breakdown-voltage gate electrode HGN while reducing the extending width to the depth direction of the semiconductor region (lightly doped semiconductor region) NLD1. In the ion implantation step of the n type impurity, the n type impurity is introduced selectively into the HN region HNR by using a mask film (for example, resist film) that exposes the HN region HNR and covers the HP region HPR, the LN region LNR, and the LP region LPR.

The semiconductor region PLD1 is formed by introducing a p type impurity boron (B) by ion implantation from a direction tilted by about 45° with respect to a direction perpendicular to the main surface of the semiconductor substrate 1 (in other words, a direction tilted by about 45° with respect to the main surface of the semiconductor substrate 1). The implantation amount (dose) of the impurity is, for example, $5 \times 10^{12}/cm^2$ and the implantation energy is, for example, 35 KeV. During this implantation, the high-breakdown-voltage gate electrode HGP functions as an ion implantation mask, while the p type impurity is implanted into the semiconductor substrate 1 (in other words, into the n well region NW) from the outside of the high-breakdown-voltage gate electrode HGP. The p type impurity thus implanted is then subjected to activation annealing. After annealing, the semiconductor region (lightly doped semiconductor region) PLD1 extends to below the high-breakdown-voltage gate electrode HGP by a distance (b) from the end portion of the high-breakdown-voltage gate electrode HGP and extends in the depth direction by the distance (b) from the main surface of the semiconductor substrate 1 at the end portion of the high-breakdown-voltage gate electrode HGP. Ion implantation of the p type impurity from a direction tilted by about 45° with respect to a direction perpendicular to the main surface of the semiconductor substrate 1 makes it possible make the extending width (b) to below the high-breakdown-voltage gate electrode HGP equal to the extending width (b) in the depth direction. Compared with ion implantation of the p type impurity perpendicularly to the main surface of the semiconductor substrate 1, the above-described ion implantation makes it possible to increase the extending width of the semiconductor region (lightly doped semiconductor region) PLD1 to below the high-breakdown-voltage gate electrode HGP while reducing the extending width of it in the depth direction. In the ion implantation step of the p type impurity, the p type impurity is introduced selectively into the HP region HPR by using a mask film (for example, resist film) that exposes the HP region HPR and covers the HN region HNR, the LN region LNR, and the LP region LPR.

Figure 6:
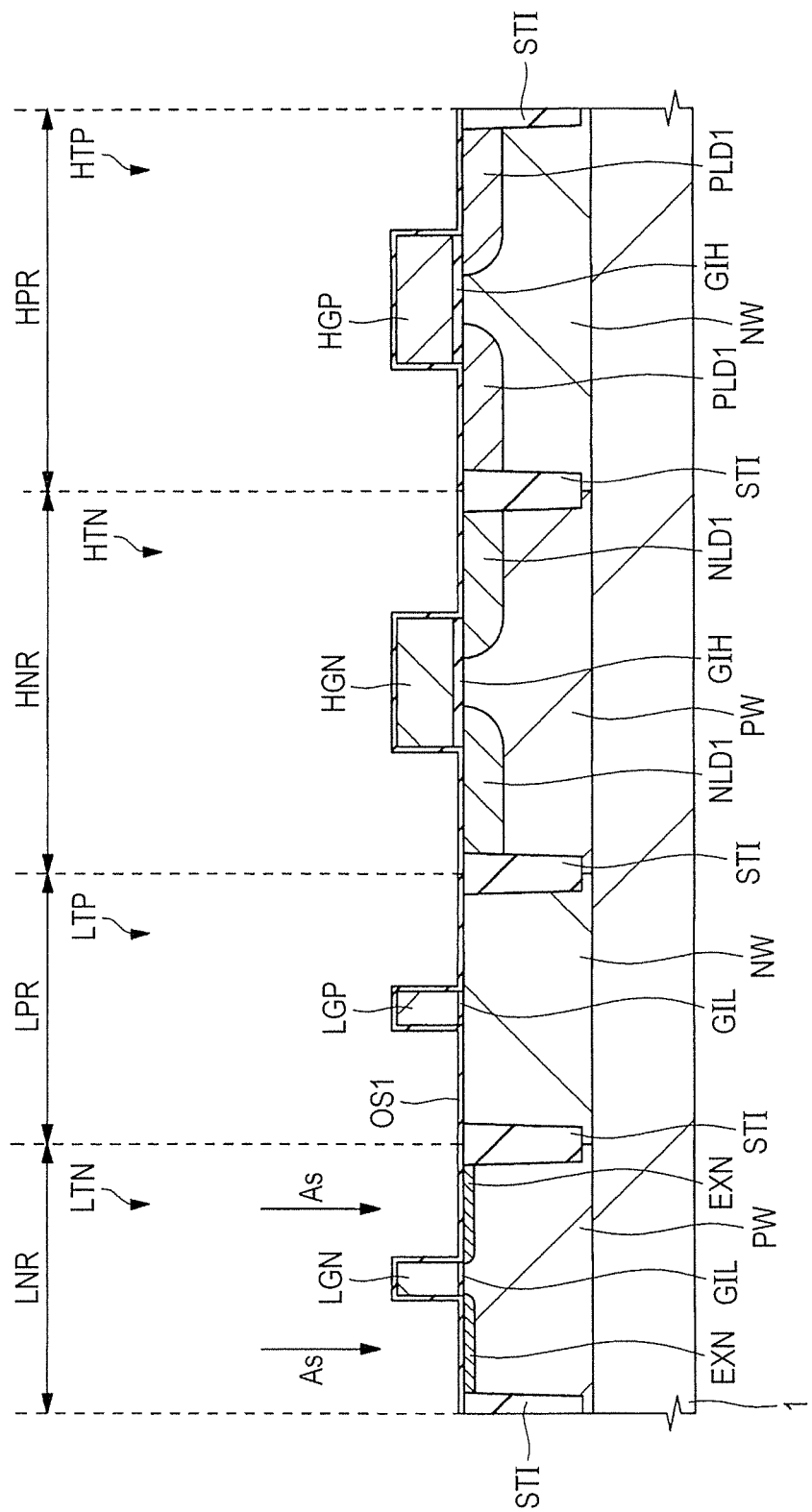
FIG. 6 is a fragmentary cross-sectional view of the semiconductor device during a manufacturing step following that of FIG. 5.

Next, as shown in FIG. 6, after removal of the mask film, an offset spacer (sidewall insulating film) OS1 made of an insulating film such as silicon oxide film or silicon nitride film is formed on the main surface of the semiconductor substrate 1. The offset spacer OS1 is formed on the upper surface and side surface of the high-breakdown-voltage gate electrodes HGN and HGP and the low-breakdown-voltage gate electrodes LGN and LGP. The offset spacer OS1 is also formed on the main surface of the semiconductor substrate 1 and it has a thickness of about 4 nm.

Next, in the LN region LNR, a semiconductor region (lightly doped semiconductor region) EXN is formed in the p well region PW at both ends of the low-breakdown-voltage gate electrode LGN. The semiconductor region EXN is formed by introducing arsenic (As), an n type impurity, into the main surface of the semiconductor substrate 1 from a direction almost perpendicular thereto. The impurity is implanted at an implantation amount (dose) of, for example, $2 \times 10^{15}/cm^2$ and an implantation energy of for example 3 Key. During this implantation, the low-breakdown-voltage gate electrode LGN and the offset spacer OS1 located on the side wall of the low-breakdown-voltage gate electrode LGN function as an ion implantation mask and the n type impurity is implanted into the semiconductor substrate 1 (in other words, the p well region PW) from the outside of the low-breakdown-voltage gate electrode LGN and offset spacer OS1. The semiconductor region (lightly doped semiconductor region) EXN is formed in a region between the low-breakdown-voltage gate electrode LGN and the element isolation region STI and it extends to below the low-breakdown-voltage gate electrode LGN. In the ion implantation step of the n type impurity, the n type impurity is introduced selectively into the LN region LNR by using a mask film (for example, a resist film) that exposes the LN region LNR and covers the LP region LPR, the HN region HNR, and the HP region HPR.

Figure 7:
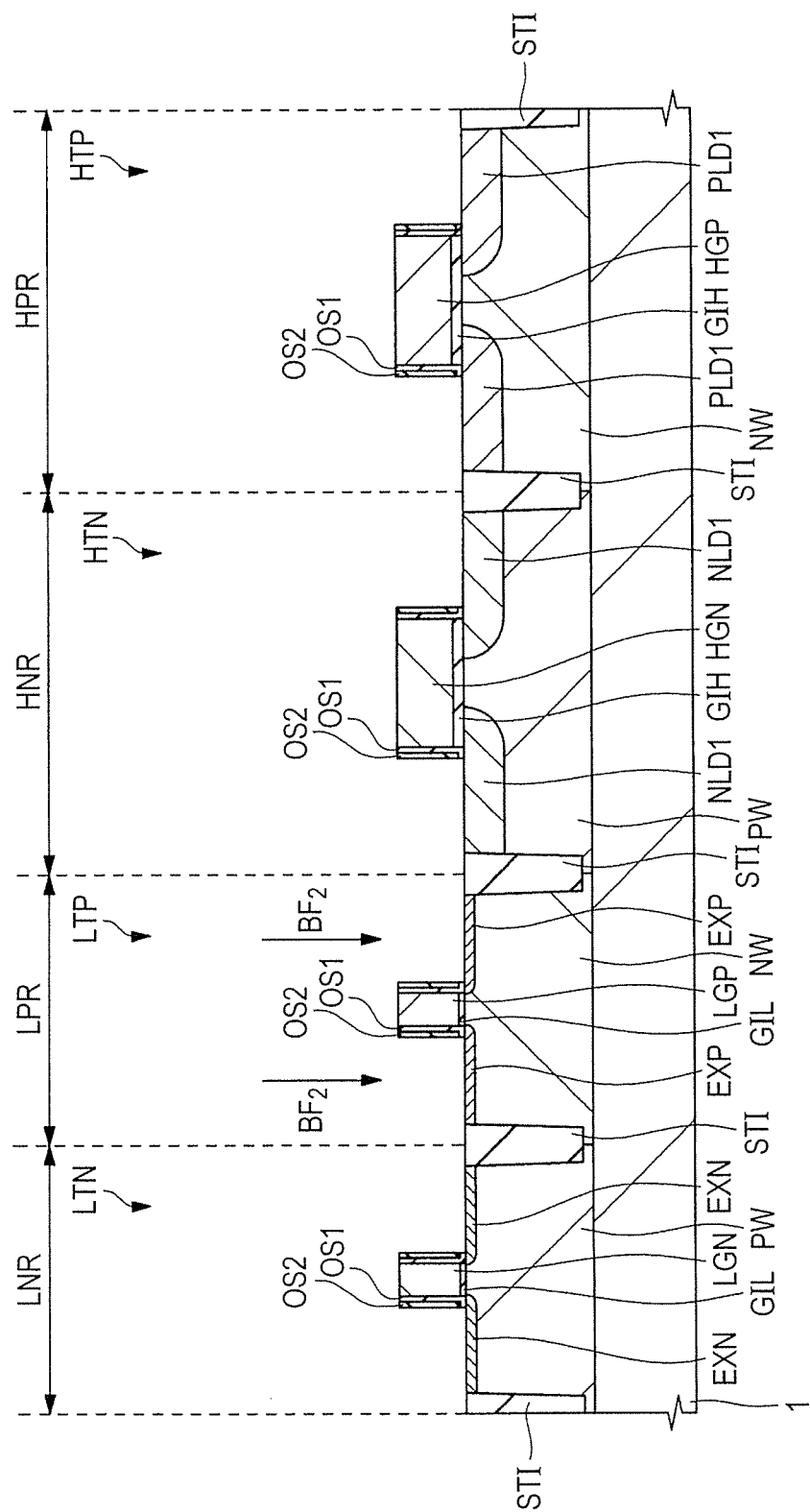
FIG. 7 is a fragmentary cross-sectional view of the semiconductor device during a manufacturing step following that of FIG. 6.

Next, as shown in FIG. 7, an offset spacer (sidewall insulating film) OS2 is formed on the offset spacer OS1 and in the n well region NW at both ends of the low-breakdown-voltage gate electrode LGP, a semiconductor region (lightly doped semiconductor region) EXP is formed.

First, an insulating film, for example, about 7 nm thick and made of a silicon nitride film or a silicon oxide film is deposited on the offset spacer OS1 and then the insulating film is anisotropically etched to form an offset spacer OS2 on the side wall of the low-breakdown-voltage gate electrode LGP in the LP region LPR. Among the offset spacer OS2, the side wall of the low-breakdown-voltage gate electrode LGP, and the main surface of the semiconductor substrate 1, an L-shaped offset spacer OS1 remains. Similarly, in the LN region LNR, an offset spacer OS2 is formed on the side wall of the low-breakdown-voltage gate electrode LGN and among the offset spacer OS2, the side wall of the low-breakdown-voltage gate electrode LGN, and the main surface of the semiconductor substrate 1, an L-shaped offset spacer OS1 remains. Similarly, in the HN region HNR, an offset spacer OS2 is formed on the side wall of the high-breakdown-voltage gate electrode HGN and among the offset spacer OS2, the side wall of the high-breakdown-voltage gate electrode HGN, and the main surface of the semiconductor substrate 1, an L-shaped offset spacer OS1 remains. Similarly, in the HR region HRR, an offset spacer OS2 is formed on the side wall of the high-breakdown-voltage gate electrode HGP and among the offset spacer OS2, the side wall of the high-breakdown-voltage gate electrode HGP, and the main surface of the semiconductor substrate 1, an L-shaped offset spacer OS1 remains.

The semiconductor region EXP is formed by introducing boron fluoride ($BF_2$), which is a p type impurity, into the main surface of the semiconductor substrate 1 in a direction substantially perpendicular thereto. The impurity is implanted in an amount (dose) of, for example, $2\times10^{15}/cm^2$ at an implantation energy of, for example, about 3 KeV. During this implantation, the low-breakdown-voltage gate electrode LGP and the offset spacers OS1 and OS2 function as an ion implantation mask. The p type impurity is implanted into the semiconductor substrate 1 (in other words, the n well region NW) from the outside of the low-breakdown-voltage gate electrode LGP and the offset spacers OS1 and OS2. The semiconductor region (lightly doped semiconductor region) EXP is formed in a region between the low-breakdown-voltage gate electrode LGP and the element isolation region STI, but it extends to below the low-breakdown-voltage gate electrode LGP. In the ion implantation step of the p type impurity, the p type impurity is introduced selectively into the LP region LPR using a mask film (for example, resist film) that exposes the LP region LPR and covers the LN region LNR, the HN region HNR, and the HP region HPR.

Figure 8:
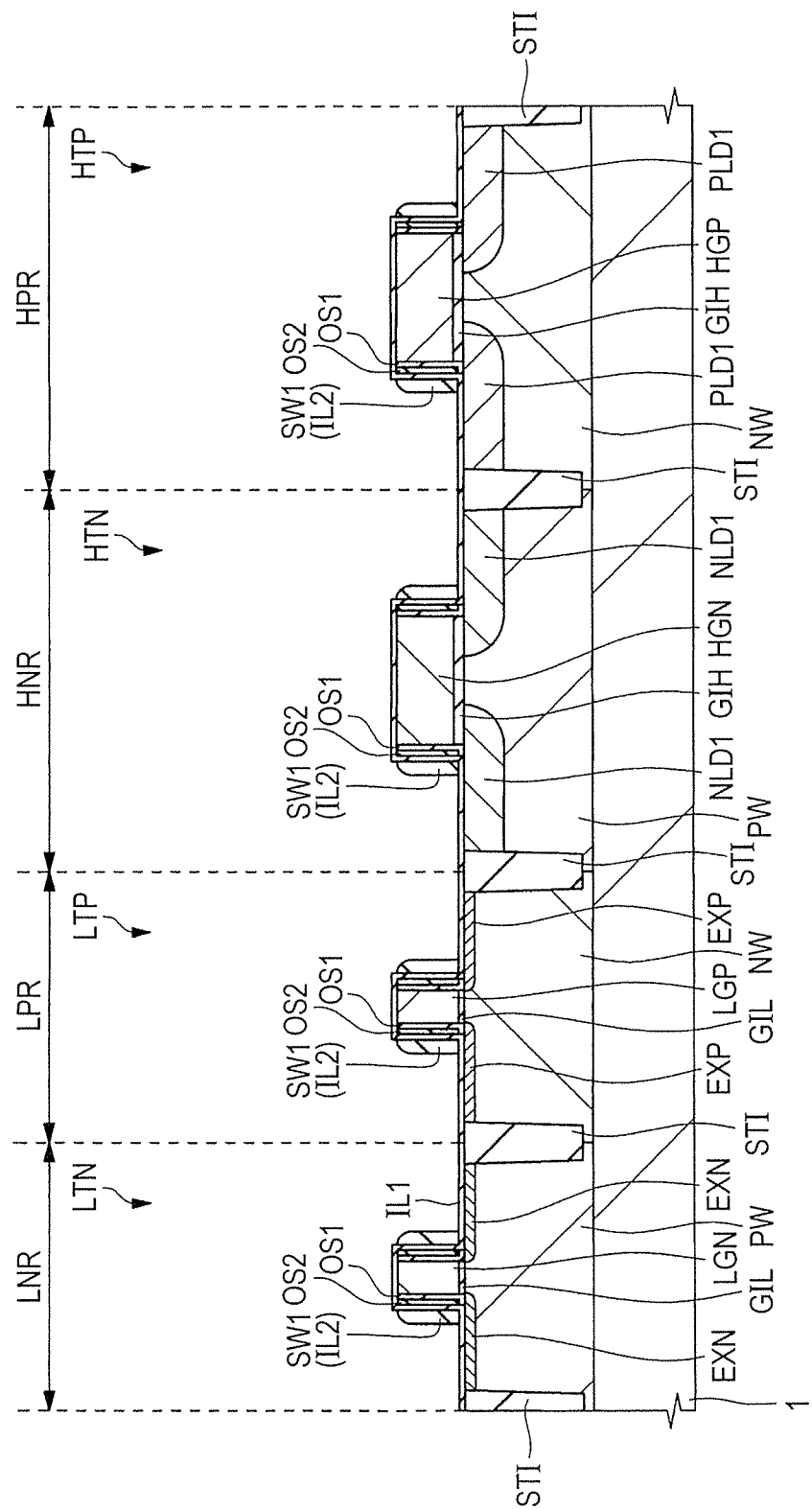
FIG. 8 is a fragmentary cross-sectional view of the semiconductor device during a manufacturing step following that of FIG. 7.

Next, as shown in FIG. 8, an insulating film IL1 and a sidewall insulating film SW1 are formed. First, the above-described mask film used in the ion implantation step of the p type impurity is removed. Next, an insulating film IL1 about 5 nm thick and made of a silicon nitride film is deposited on the main surface of the semiconductor substrate 1 and an insulating film IL2 about 40 nm thick and made of a silicon oxide film is deposited on the insulating film IL1. Next, the insulating film IL2 is anisotropically etched to form a sidewall insulating film SW1. Anisotropic etching is performed at an etching rate of the insulating film IL2 greater than that of the insulating film IL1 so that the insulating film IL1 is left without being etched. Alternatively, a silicon oxide film is used as the insulating film IL1 and a silicon nitride film is used as the insulating film IL2.

In the HN region HNR, the sidewall insulating film SW1 is formed on the side wall of the high-breakdown-voltage gate electrode HGN via the offset spacers OS1 and OS2 and the insulating film IL1. The high-breakdown-voltage gate electrode HGN has, on the upper surface thereof, and the semiconductor substrate 1 has, on the main surface thereof, the insulating film IL1. The HP region HPR, the LN region LNR, and the LP region LPR also have a similar constitution.

Figure 9:
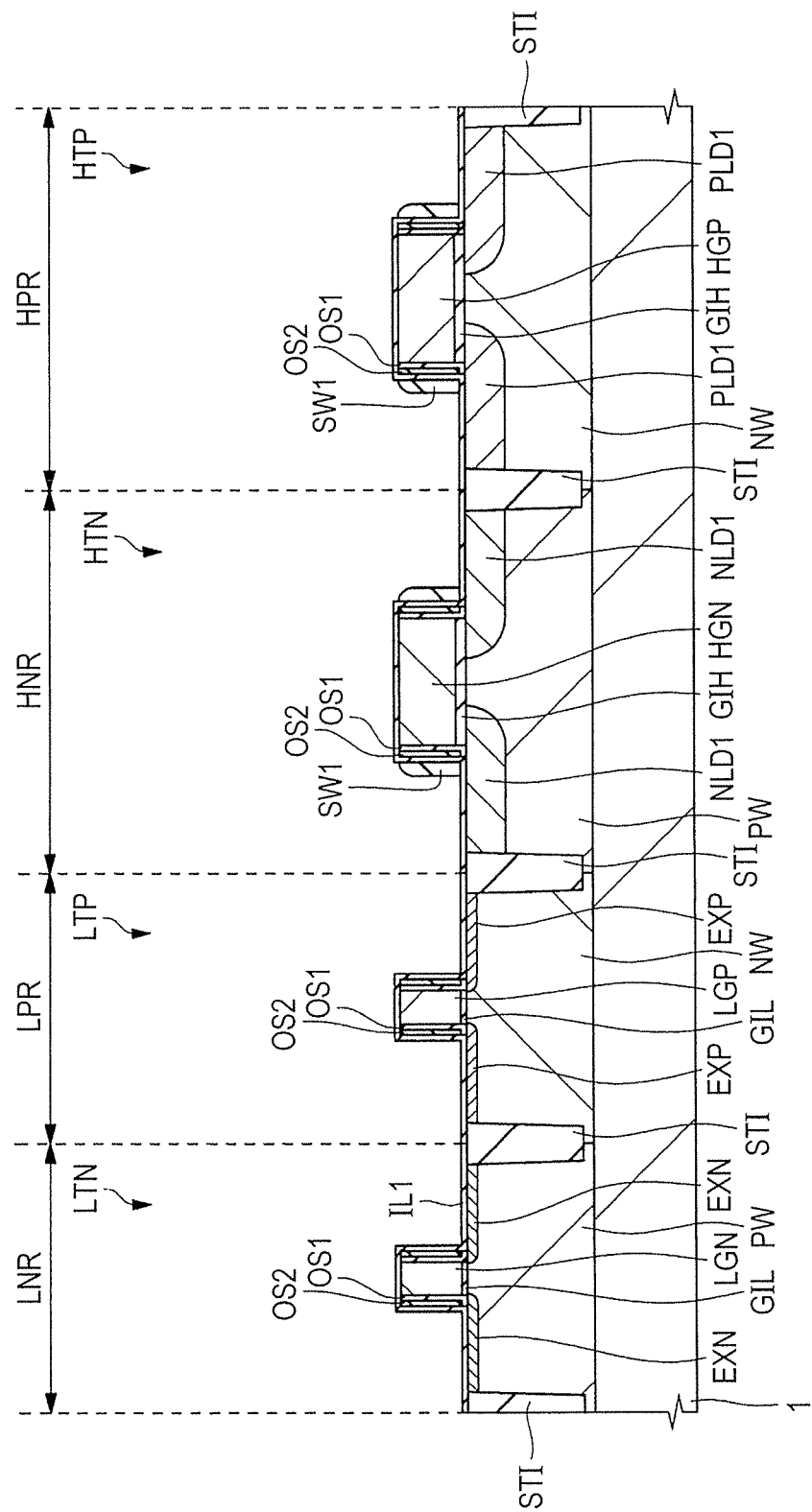
FIG. 9 is a fragmentary cross-sectional view of the semiconductor device during a manufacturing step following that of FIG. 8.

Next, as shown in FIG. 9, the sidewall insulating film SW1 is selectively removed from the LN region LNR and the LP region LPR. Although not illustrated here, a mask film (for example, a resist film) that exposes the LN region LNR and the LP region LPR and covers the HN region HNR and the HP region HPR is used for the removal. The sidewall insulating film SW1 can be removed selectively while leaving the insulating film IL1 in the LN region LNR and the LP region LPR by wet etching at an etching rate of the insulating film IL2 greater than that of the insulating film IL1 so that. Then, the mask film is removed. The sidewall insulating film SW1 in the HN region HNR and the HP region HPR remains without being removed.

Figure 10:
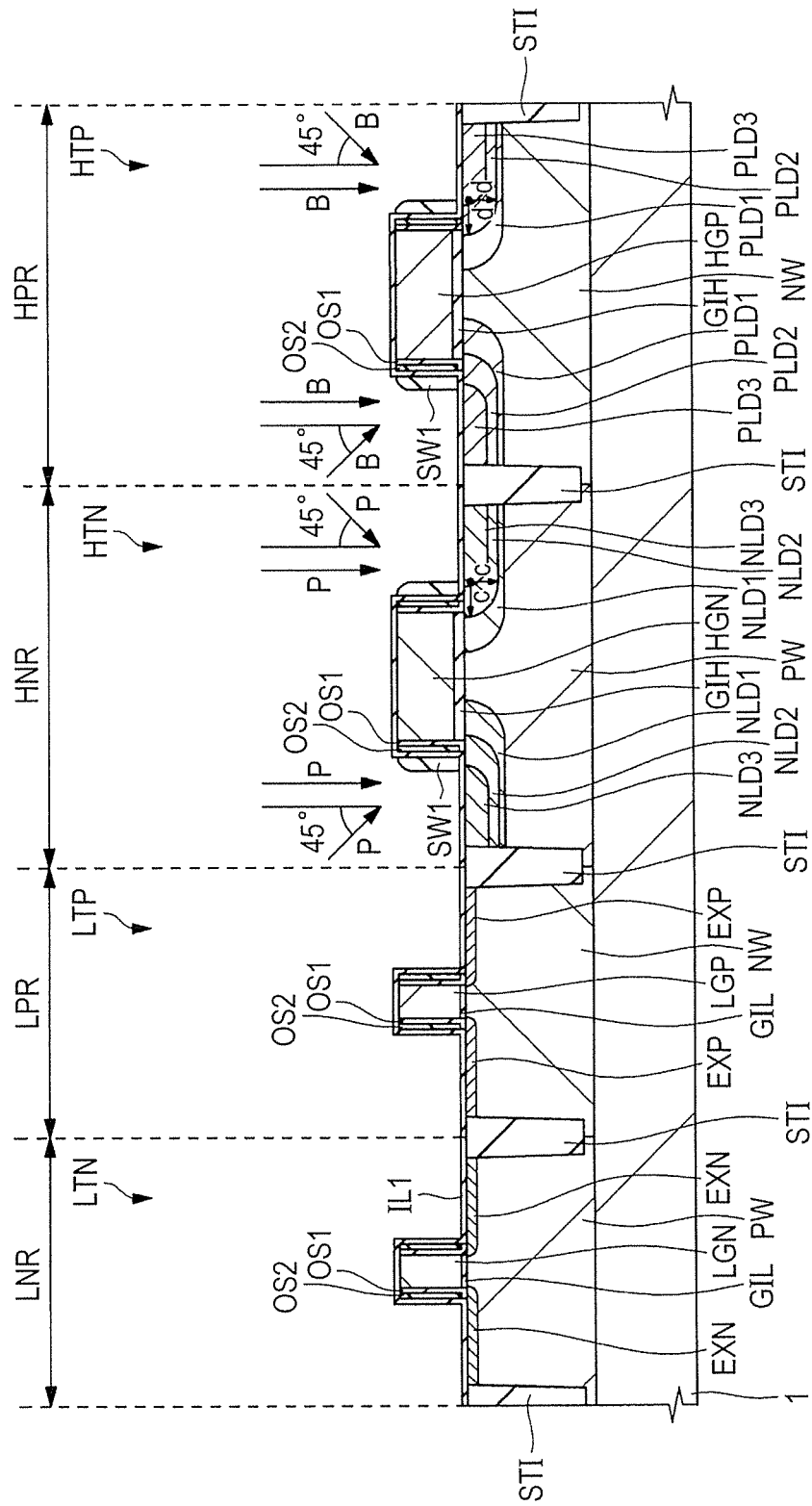
FIG. 10 is a fragmentary cross-sectional view of the semiconductor device during a manufacturing step following that of FIG. 9.

Next, as shown in FIG. 10, in the HN region HNR, semiconductor regions (lightly doped semiconductor regions) NLD2 and NLD3 are formed in the p well region PW at both ends of the high-breakdown-voltage gate electrode HGN. Next, in the HP region HPR, semiconductor regions (lightly doped semiconductor regions) PLD2 and PLD3 are formed in the n well region PW at both ends of the high-breakdown-voltage gate electrode HGP. The formation order of the semiconductor regions (lightly doped semiconductor regions) NLD2 and NLD3 and the semiconductor regions (lightly doped semiconductor regions) PLD2 and PLD3 may be reversed.

The semiconductor region NLD2 is formed by introducing phosphorus (P), which is an n type impurity, into the main surface of the semiconductor substrate 1 by ion implantation from a direction tilted by about 45° with respect to a direction perpendicular thereto. The impurity is implanted in an amount (dose) of, for example, $1\times10^{13}/cm^2$, at an implantation energy of, for example, 45 KeV. During this implantation, the high-breakdown-voltage gate electrode HGN, the offset spacers OS1 and OS2, and the sidewall insulating film SW1 function as an ion implantation mask and the n type impurity is implanted into the semiconductor substrate 1 (in other words, the p well region PW) from the outside of the high-breakdown-voltage gate electrode HGN, the offset spacers OS1 and OS2, and the sidewall insulating film SW1. The n type impurity thus implanted is subjected to activation annealing. After annealing, the semiconductor region (lightly doped semiconductor region) NLD2 extends in a direction toward the high-breakdown-voltage gate electrode HGN by a distance (c) from the end portion of the sidewall insulating film SW1 on the side opposite to the high-breakdown-voltage gate electrode HGN and extends in a depth direction by a distance (c) from the main surface of the semiconductor substrate 1 at the end portion of the sidewall insulating film SW1. This means that the semiconductor region NLD2 has a depth (c). Ion implantation of the n type impurity into the main surface of the semiconductor substrate 1 from a direction tilted by about 45° with respect to a direction perpendicular thereto makes it possible to make the extending width (c) of the semiconductor region (lightly doped semiconductor region)

NLD2 in the direction toward the high-breakdown-voltage gate electrode HGN equal to the extending width (c) of the region in the depth direction. Compared with ion implantation of the n type impurity perpendicularly to the main surface of the semiconductor substrate 1, it enables an increase in the extending width of the semiconductor region (lightly doped semiconductor region) NLD2 toward the high-breakdown-voltage gate electrode HGN while reducing the extending width of it in the depth direction. In the ion implantation step of the n type impurity, the n type impurity is selectively introduced into the HN region HNR by using a mask film (for example, a resist film) that exposes the HN region NHR and covers the HP region HPR, the LN region LNR, and the LP region LPR. In the ion implantation step for forming the semiconductor region NLD2, similar to the offset spacers OS1 and OS2 and the sidewall insulating film SW1, the insulating film IL1 located on the high-breakdown-voltage gate electrode HGN also functions as an ion implantation mask so that the insulating film IL1 located on the high-breakdown-voltage gate electrode HGN can also be called "sidewall insulating film".

Using the above-described mask film, a semiconductor region (lightly doped semiconductor region) NLD3 is also formed by ion implantation. For the formation of the semiconductor region NLD3, phosphorus (P), which is an n type impurity, is introduced into the main surface of the semiconductor substrate 1 from a direction substantially perpendicular thereto. The impurity is implanted in an amount (dose) of, for example, $5 \times 10^{13}/cm^2$ at an implantation energy of, for example, 30 KeV. During this implantation, the high-breakdown-voltage gate electrode HGN, the offset spacers OS1 and OS2, and the sidewall insulating film SW1 function as an ion implantation mask and the n type impurity is introduced into the semiconductor substrate 1 (in other words, the p well region PW) from the outside of the high-breakdown-voltage gate electrode HGN, the offset spacers OS1 and OS2, and the sidewall insulating film SW1. In the ion implantation step for forming the semiconductor region NLD3, the insulating film IL1 on the high-breakdown-voltage gate electrode HGN functions, similar to the offset spacers OS1 and OS2 and the sidewall insulating film SW1, as an ion implantation mask so that the insulating film IL1 located on the high-breakdown-voltage gate electrode HGN may also be called "sidewall insulating film".

The semiconductor region NLD2 has an impurity concentration higher than that of the semiconductor region NLD1 and it has a smaller depth. In addition, it is placed on the side closer to the end portion of the high-breakdown-voltage gate electrode HGN than the semiconductor region NLD1 is. This means that the semiconductor region NLD2 is within the semiconductor region NLD1 in both the gate length direction and depth direction and the semiconductor region NLD1 having an impurity concentration lower than that of the semiconductor region NLD2 is contiguous to the p well region PW. Therefore, the extending depth (a) of the semiconductor region NLD1 is greater than the extending width (c) of the semiconductor region NLD2 in both the gate length direction and the depth direction.

The semiconductor region NLD3 has an impurity concentration higher than that of the semiconductor region NLD2 and has a depth smaller than that of the semiconductor region NLD2. The semiconductor region NLD3 is within the semiconductor region NLD2 in both the gate length direction and the depth direction. The semiconductor region NLD2 has a depth (c) smaller (shallower) than the depth (a) of the semiconductor region NLD1.

The semiconductor region PLD2 is formed by introducing boron (B), which is a p type impurity, into the main surface of the semiconductor substrate 1 by ion implantation from a direction tilted by about 45° with respect to a direction perpendicular thereto. The impurity is implanted in an amount (dose) of, for example, $1 \times 10^{13}/cm^2$, at an implantation energy of, for example, 15 KeV. During this implantation, the high-breakdown-voltage gate electrode HGP, the offset spacers OS1 and OS2, and the sidewall insulating film SW1 function as an ion implantation mask and the p type impurity is implanted into the semiconductor substrate 1 (in other words, the n well region PW) from the outside of the high-breakdown-voltage gate electrode HGP, the offset spacers OS1 and OS2, and the sidewall insulating film SW1. The p type impurity thus implanted is subjected to activation annealing. After annealing, the semiconductor region (lightly doped semiconductor region) PLD2 extends toward the high-breakdown-voltage gate electrode HGP by a distance (d) from the end portion of the sidewall insulating film SW1 on the side opposite to the high-breakdown-voltage gate electrode HGP and extends in a depth direction by a distance (d) from the main surface of the semiconductor substrate 1 at the end portion of the sidewall insulating film SW1. Ion implantation of the p type impurity into the main surface of the semiconductor substrate 1 from a direction tilted by about 45° with respect to a direction perpendicular thereto makes it possible to make the extending width (d) of the semiconductor region (lightly doped semiconductor region) PLD2 toward the high-breakdown-voltage gate electrode HGP equal to the extending width (d) of the region in the depth direction. Compared with ion implantation of the p type impurity perpendicularly to the main surface of the semiconductor substrate 1, the above-described ion implantation makes it possible to increase the extending width of the semiconductor region (lightly doped semiconductor region) PLD2 toward the high-breakdown-voltage gate electrode HGP while reducing the extending width of it in the depth direction. In the ion implantation step of the p type impurity, the p type impurity is selectively introduced into the HP region HPR by using a mask film (for example, a resist film) that exposes the HP region HPR and covers the HN region HPR, the LN region LNR, and the LP region LPR. In the ion implantation step for forming the semiconductor region PLD2, the insulating film IL1 located on the high-breakdown-voltage gate electrode HGP also functions, similar to the offset spacers OS1 and OS2 and the sidewall insulating film SW1, as an ion implantation mask so that the insulating film IL1 located on the high-breakdown-voltage gate electrode HGP may also be called "sidewall insulating film".

Using the above-described mask film, a semiconductor region (lightly doped semiconductor region) PLD3 is formed also by ion implantation. For the formation of the semiconductor region PLD3, boron (B), which is a p type impurity, is introduced into the main surface of the semiconductor substrate 1 from a direction substantially perpendicular thereto. The impurity is implanted in an amount (dose) of, for example, $5 \times 10^{13}/cm^2$ at an implantation energy of, for example, 8 KeV. During this implantation, the high-breakdown-voltage gate electrode HGP, the offset spacers OS1 and OS2, and the sidewall insulating film SW1 function as an ion implantation mask and the p type impurity is introduced into the semiconductor substrate 1 (in other words, the n well region NW) from the outside of the high-breakdown-voltage gate electrode HGP, the offset spacers OS1 and OS2, and the sidewall insulating film SW1. In the ion implantation step for forming the semiconductor region PLD3, the insulating film IL1 on the high-breakdown-voltage gate electrode HGP functions, similar to the offset spacers OS1 and OS2 and the sidewall insulating film SW1, as an ion implantation mask so that the insulating film IL1 located on the high-breakdown-voltage gate electrode HGP may also be called "sidewall insulating film".

The semiconductor region PLD2 has an impurity concentration higher than that of the semiconductor region PLD1 and it has a smaller depth. In addition, it is placed on the side closer to the end portion of the high-breakdown-voltage gate electrode HGP than the semiconductor region PLD1 is. This means that the semiconductor region PLD2 is within the semiconductor region PLD1 in both the gate length direction and depth direction and the semiconductor region PLD1 having an impurity concentration lower than that of the semiconductor region PLD2 is contiguous to the n well region NW. Therefore, the extending depth (b) of the semiconductor region PLD1 is greater than the extending width (d) of the semiconductor region PLD2 in both the gate length direction and the depth direction.

The semiconductor region PLD3 has an impurity concentration higher than that of the semiconductor region PLD2 and has a depth smaller than that of the semiconductor region PLD2. The semiconductor region PLD3 is within the semiconductor region PLD2 in both the gate length direction and the depth direction. The semiconductor region PLD2 has a depth (d) smaller (shallower) than the depth (b) of the semiconductor region PLD1.

Figure 11:
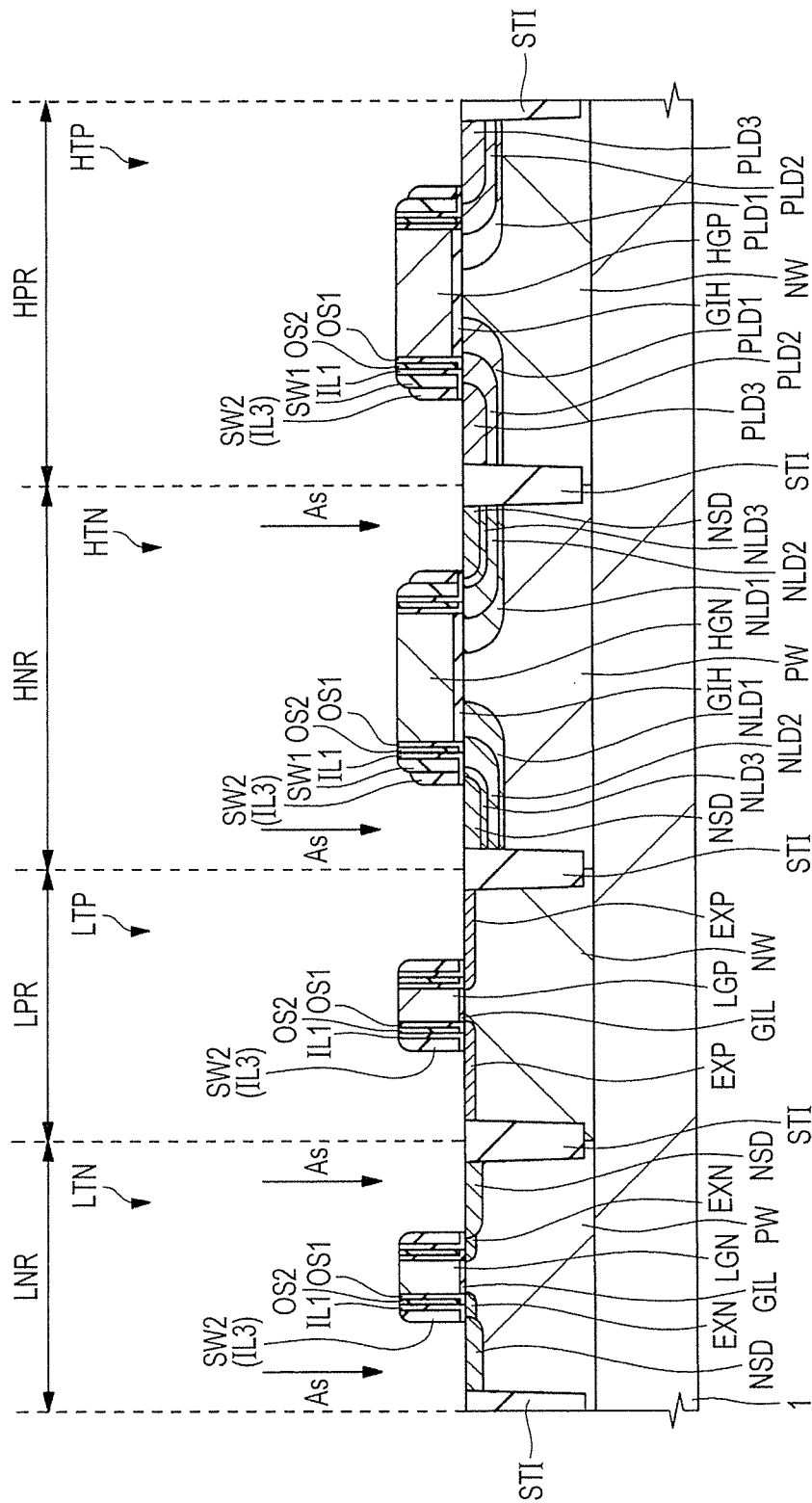
FIG. 11 is a fragmentary cross-sectional view of the semiconductor device during a manufacturing step following that of FIG. 10.

Next, as shown in FIG. 11, a sidewall insulating film SW2 and a semiconductor region (heavily doped semiconductor region) NSD are formed.

After removal of the mask films for forming the semiconductor regions PLD2 and PLD3, an insulating film IL3 about 30 nm thick and made of a silicon oxide film is deposited on the main surface of the semiconductor substrate 1. Next, the insulating film IL3 and the insulating film IL1 are anisotropically etched to form a sidewall insulating film SW2.

In the LN region LNR, the sidewall insulating film SW2 is on the the side wall of the low-breakdown-voltage gate electrode LGN via the offset spacers OS1 and OS2 and the insulating film IL1. By this anisotropic dry etching, the insulating film IL1 on the upper surface of the low-breakdown-voltage gate electrode LGN and on the main surface of the semiconductor substrate 1 between the sidewall insulating film SW2 and the element isolation region STI are removed. The insulating film IL1 remains as an L-shaped film between the offset spacer OS2 and the sidewall insulating film SW2 and between the sidewall insulating film SW2 and the main surface of the semiconductor substrate 1. Also in the LP region LPR, similar to the LN region LNR, a sidewall insulating film SW2 is formed.

In the HN region HNR, the sidewall insulating film SW2 is on the the side wall of the high-breakdown-voltage gate electrode HGN via the offset spacers OS1 and OS2, the insulating film IL1, and the sidewall insulating film SW1. By this anisotropic dry etching, the insulating film IL1 on the upper surface of the high-breakdown-voltage gate electrode HGN and on the main surface of the semiconductor substrate 1 between the sidewall insulating film SW2 and the element isolation region STI are removed. The insulating film IL1 remains as an L-shaped film between the offset spacer OS2 and the sidewall insulating film SW1 and between the sidewall insulating films SW1 and SW2 and the main surface of the semiconductor substrate 1. Also in the HP region HPR, similar to the HN region HNR, a sidewall insulating film SW2 is formed.

The semiconductor region NSD is formed by introducing arsenic (As), which is an n type impurity, into the main surface of the semiconductor substrate 1 from a direction substantially perpendicular thereto. The impurity is implanted in an amount (dose) of, for example, $5 \times 10^{15}/cm^2$ at an implantation energy of, for example, 20 KeV. In the ion implantation step of the n type impurity, the n type impurity is introduced selectively into the LN region LNR and the HN region HNR by using a mask film (for example, a resist film) that exposes the LN region LNR and the HN region HNR and covers the LP region LPR and the HP region HPR.

In the LN region LNR, the low-breakdown-voltage gate electrode LGN, the offset spacers OS1 and OS2, the insulating film IL1, and the sidewall insulating film SW2 function as an ion implantation mask and the n type impurity is implanted into the semiconductor substrate 1 (in other words, the p well region PW) from the outside of the low-breakdown-voltage gate electrode LGN, the offset spacers OS1 and OS2, the insulating film IL1, and the sidewall insulating film SW2. The semiconductor region NSD thus formed has an impurity concentration higher than that of the semiconductor region EXN and has a depth greater than that of the semiconductor region EXN.

In the HN region HNR, the high-breakdown-voltage gate electrode HGN, the offset spacers OS1 and OS2, the insulating film IL1, the sidewall insulating film SW1, and the sidewall insulating film SW2 function as an ion implantation mask. The n type impurity is implanted into the semiconductor substrate 1 (in other words, the p well region PW) from the outside of the high-breakdown-voltage gate electrode HGN, the offset spacers OS1 and OS2, the insulating film IL1, the sidewall insulating film SW1, and the sidewall insulating film SW2. The semiconductor region NSD thus formed has an impurity concentration higher than that of the semiconductor region NLD3 and has a depth smaller than that of the semiconductor region NLD3.

Figure 12:
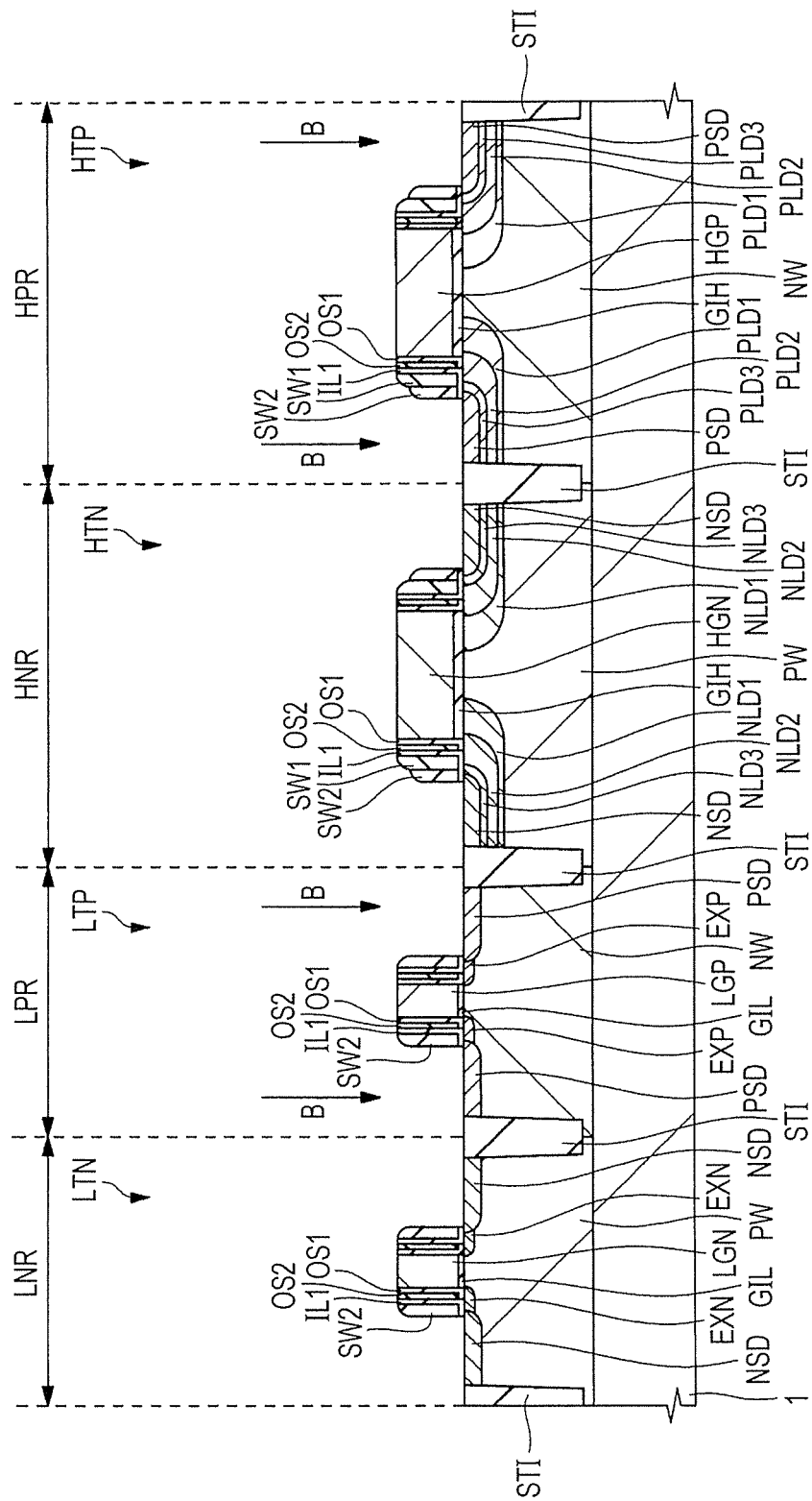
FIG. 12 is a fragmentary cross-sectional view of the semiconductor device during a manufacturing step following that of FIG. 11.

Next, after removal of the mask film for the formation of the semiconductor region NSD, boron (B) which is a p type impurity is introduced into the main surface of the semiconductor substrate 1 from a direction substantially perpendicular thereto for the formation of a semiconductor region (heavily doped semiconductor region) PSD, as shown in FIG. 12. The implantation amount (dose) of the impurity is, for example, $5 \times 10^{15}/cm^2$ and the implantation energy is, for example, 2 KeV. In the ion implantation step of the p type impurity, the p type impurity is selectively introduced into the LP region LPR and the HP region HPR by using a mask film (for example, a resist film) that exposes the LP region LPR and the HP region HPR and covers the LN region LNR and the HN region HNR.

In the LP region LPR, the low-breakdown-voltage gate electrode LGP, the offset spacers OS1 and OS2, the insulating film IL1, and the sidewall insulating film SW2 function as an ion implantation mask and the p type impurity is implanted into the semiconductor substrate 1 (in other words, the n well region NW) from the outside of the low-breakdown-voltage gate electrode LGP, the offset spacers OS1 and OS2, the insulating film IL1, and the sidewall insulating film SW2. The semiconductor region PSD thus formed has an impurity concentration higher than that of the semiconductor region EXP and has a depth greater than that of the semiconductor region EXP.

In the HP region HPR, the high-breakdown-voltage gate electrode HGP, the offset spacers OS1 and OS2, the insulating film IL1, the sidewall insulating film SW1, and the sidewall insulating film SW2 function as an ion implantation mask. The p type impurity is implanted into the semiconductor substrate 1 (in other words, the n well region NW) from the outside of the high-breakdown-voltage gate electrode HGP, the offset spacers OS1 and OS2, the insulating film IL1, the sidewall insulating film SW1, and the sidewall insulating film SW2. The semiconductor region PSD thus formed has an impurity concentration higher than that of the semiconductor region PLD3 and has a depth smaller than that of the semiconductor region PLD3.

Figure 13:
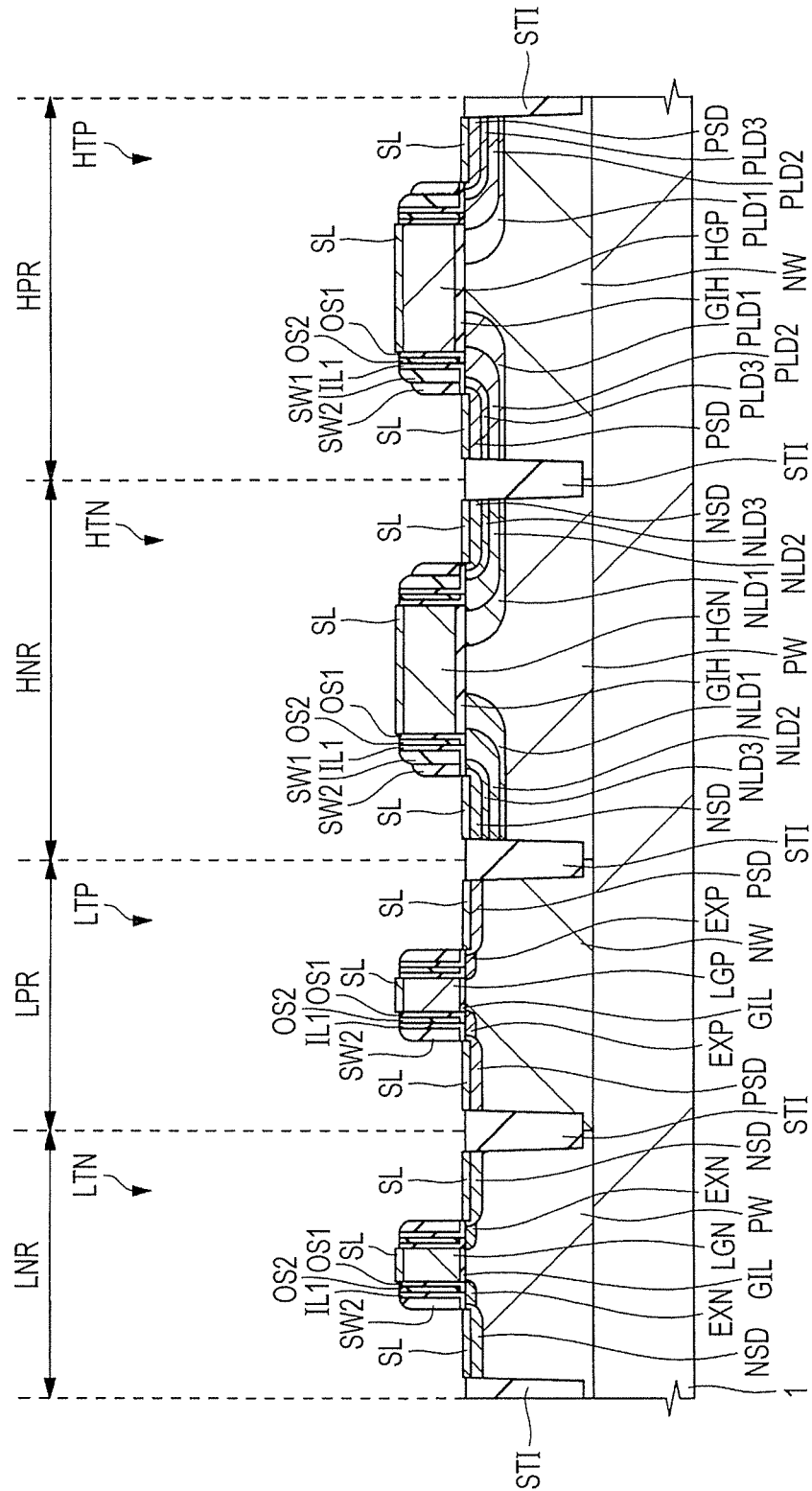
FIG. 13 is a fragmentary cross-sectional view of the semiconductor device during a manufacturing step following that of FIG. 12.

Next, after removal of the mask film for the formation of the semiconductor region PSD, a silicide layer SL is formed as shown in FIG. 13. The silicide layer SL is comprised of, for example, a cobalt silicide (CoSi) layer, a nickel silicide (NiSi) layer, or a platinum (Pt)-containing nickel silicide (NiSi) layer.

In the LN region LNR, the silicide layer SL is on the upper surface of the semiconductor region NSD exposed from the sidewall insulating film SW2 and the element isolation region STI. Further, the silicide layer SL is on the upper surface of the low-breakdown-voltage gate electrode LGN. In plan view and cross-sectional view, the silicide layer SL is enclosed in the semiconductor region NSD or the element isolation region STI and is not in contact with the semiconductor region EXN.

Also in the LP region LPR, the silicide layer SL has a constitution similar to that of the LN region LNR.

In the HN region HNR, the silicide layer SL is on the upper surface of the semiconductor region NSD exposed from the sidewall insulating film SW2 and the element isolation region STI. Further, the silicide layer SL is on the upper surface of the high-breakdown-voltage gate electrode HGN. In plan view and cross-sectional view, the silicide layer SL is enclosed in the semiconductor region NSD or the element isolation region STI and is in contact with none of the semiconductor regions NLD3, NLD2, and NLD1.

Also in the HP region HPR, the silicide layer SL has a constitution similar to that of the HN region HNR.

Next, an interlayer insulating film IF having a plurality of openings therein is formed on the main surface of the semiconductor substrate 1. The interlayer insulating film IF is made of an insulating film (inorganic insulating film) such as a silicon oxide film, a silicon nitride film, or a stacked film of a silicon nitride film and a silicon oxide film formed thereon. The interlayer insulating film IF exposes, from the openings thereof, a portion of the upper surface (surface) of the silicide layer SL formed on the surface of the semiconductor regions PSD and NSD.

Next, a plug electrode PG made of a metal film is formed in the openings of the interlayer insulating film IF. The plug electrode PG has a stacked structure of a barrier film such as tungsten nitride (TiW) film or titanium nitride (TiN) film and tungsten (W). The silicide layer SL has, on the surface thereof, and the openings have, on the side wall thereof, a barrier film and the barrier film has thereon a tungsten film.

Next, a plurality of wirings WL is formed on the upper surface of the interlayer insulating film IF so as to be in contact with the plug electrode PG. The wirings WL are a metal film composed mainly of an aluminum (Al) film or a copper (Cu) film and it may contain a trace amount of an impurity. For example, it may be an aluminum film containing copper or silicon or a copper film containing palladium.

By the above-described steps, the semiconductor device shown in FIG. 1 is completed.

Main characteristics of the method of manufacturing a semiconductor device according to the present embodiment will next be described.

The method of manufacturing a semiconductor device having a transistor equipped with a gate electrode, a source region, and a drain region according to the present embodiment includes the following steps: a step of providing a semiconductor substrate 1 having a main surface; a step of forming a p well region PW (a well region of a first conductivity type) in the main surface of the semiconductor substrate 1, a step of forming a high-breakdown-voltage gate electrode HGN (gate electrode) on the main surface of the semiconductor substrate 1, a step of forming a semiconductor region NLD1 (first semiconductor region) in the p well region PW (well region of the first conductivity type) by ion implantation of phosphorus (first impurity) which is an n type (a second conductivity type opposite to the first conductivity type) impurity from the outside of the high-breakdown-voltage gate electrode HGN (gate electrode) and from a direction tilted by 45° with respect to a direction perpendicular to the main surface of the semiconductor substrate 1, a step of forming a sidewall insulating film SW1 (first sidewall insulating film) on the side wall of the high-breakdown-voltage gate electrode HGN (gate electrode); a step of forming a semiconductor region NLD2 (second semiconductor region) in the p well region PW (well region of the first conductivity type) by ion implantation of phosphorus (second impurity) which is an n type impurity from the outside of the high-breakdown-voltage gate electrode HGN (gate electrode) and the sidewall insulating film SW1 (first sidewall insulating film) in a direction tilted by 45° with respect to a direction perpendicular to the main surface of the semiconductor substrate 1; a step of forming a sidewall insulating film SW2 (second sidewall insulating film) on the sidewall insulating film SW1, a step of forming a semiconductor region NSD (third semiconductor region) in the p well region (well region of the first conductivity type) by ion implantation of arsenic (third impurity) which is an n type impurity from the outside of the high-breakdown-voltage gate electrode HGN (gate electrode), the sidewall insulating film SW1 (first sidewall insulating film), and the sidewall insulating film SW2 (second sidewall insulating film) and from a direction perpendicular to the main surface of the semiconductor substrate 1; and a step of forming a silicide layer SL (silicide layer) on the surface of the semiconductor region NSD (third semiconductor region). The semiconductor region NLD1 (first semiconductor region), the semiconductor region NLD2 (second semiconductor region), and the semiconductor region NSD (third semiconductor region) constitute a source region or drain region. The impurity concentration of the semiconductor region NLD1 (first semiconductor region) is lower than that of the semiconductor region NLD2 (second semiconductor region) and ion implantation energy of phosphorus (first impurity) is greater than that of phosphorus (second impurity).

In the method of producing a semiconductor device according to the present embodiment, by adjusting the ion implantation energy of phosphorus (first impurity) greater than that of phosphorus (second impurity), the semiconductor region NLD1 having an impurity concentration lower than that of the semiconductor region NLD2 is therefore contiguous to the p well region PW. This makes it possible to improve the breakdown voltage between the source or drain region including the semiconductor region NLD1 and the semiconductor region NLD2 and the p well PW.

In addition, the semiconductor region NLD1 is formed by ion implantation of phosphorus (first impurity) from a direction tilted by 45° with respect to a direction perpendicular to the main surface of the semiconductor substrate 1, making it possible to widen the overlapping width of the high-breakdown-voltage gate electrode HGN and the semiconductor region NLD1. As a result, breakdown voltage between the source or drain region and the high-breakdown-voltage gate electrode HGN can be improved.

Further, the semiconductor region NLD1 is formed by ion implantation of the first impurity from a direction tilted by 45° with respect to a direction perpendicular to the main surface of the semiconductor substrate 1. This makes it possible to widen the overlapping width between the high-breakdown-voltage gate electrode HGN (gate electrode) and the semiconductor region NLD1 and decrease the depth of the semiconductor region NLD1 contiguous to the p well region PW. As a result, improvement in breakdown voltage between the source or drain region and the high-breakdown-voltage gate electrode HGN and between the source or drain region and the p well PW can be achieved.

Phosphorus (first impurity) for the formation of the semiconductor region NLD1 is implanted from the outside of the high-breakdown-voltage gate electrode HGN and phosphorus (second impurity) for the formation of the semiconductor region NLD2 is implanted from the outside of the high-breakdown-voltage gate electrode HGN and the sidewall insulating film SW1. This makes it possible to make the distance between the end portion of the semiconductor region NLD1 on the side of the channel formation region and the end portion of the semiconductor region NLD2 on the side of the channel formation region, each below the high-breakdown-voltage gate electrode HGN, greater than that when the gate electrode has no sidewall insulating film. In other words, the semiconductor region NLD1 below the high-breakdown-voltage gate electrode HGN can be made longer and this leads to improvement in the breakdown voltage between the source or drain region and the high-breakdown-voltage gate electrode HGN.

Phosphorus (P) is used as the first impurity for the formation of the semiconductor region NLD1 (first semiconductor region) and as the second impurity for the formation of the semiconductor region NLD2 (second semiconductor region) and arsenic (As) having a diffusion coefficient smaller than that of phosphorus (P) is used as the third impurity for the formation of the semiconductor region NSD (third semiconductor region). The impurity in the semiconductor region NSD having a high impurity concentration therefore does not diffuse even to the outside of the semiconductor regions NLD1 and NLD2 having a low impurity concentration.

An ion implantation energy of the first impurity for the formation of the semiconductor region NLD1 (first semiconductor region) is made greater than that of the third impurity for the formation of the semiconductor region NSD (third semiconductor region) so that the semiconductor region NSD can be enclosed in the semiconductor region NLD1, making it possible to form a PN junction between the semiconductor region NLD1 and the p well region PW (well region).

The high-breakdown-voltage n type transistor HTN has been described as an example. The high-breakdown-voltage p type transistor HTP also has a similar advantage.

The method of manufacturing a semiconductor device having a first transistor equipped with a first gate electrode, a first source region, and a first drain region and a second transistor equipped with a second gate electrode, a second source region, and a second drain region according to the present embodiment includes the following steps: a step of providing a semiconductor substrate 1 having, in the main surface thereof, an HN region HNR (first region) for forming therein a high-breakdown-voltage n type transistor HTN (first transistor) and an LN region LNR (second region) for forming therein a low-breakdown-voltage n type transistor LTN (second transistor); a step of forming a p well region PW (first well region of a first conductivity type) in the main surface of the semiconductor substrate 1 in the HN region HNR (first region) and forming a p well region PW (second well region of the first conductivity type) in the main surface of the semiconductor substrate 1 in the LN region LNR (second region); a step of forming a high-breakdown-voltage gate insulating film GIH (first gate insulating film) on the main surface of the semiconductor substrate 1 in the HN region HNR (first region) and forming a low-breakdown-voltage gate insulating film GIL (second gate insulating film) on the main surface of the semiconductor substrate 1 in the LN region LNR (second region); a step of forming a high-breakdown-voltage gate electrode HGN (first gate electrode) on the high-breakdown-voltage gate insulating film GIH (first gate insulating film) and a low-breakdown-voltage gate electrode LGN (second gate electrode) on the low-breakdown-voltage gate insulating film GIL (second gate insulating film); a step of forming a semiconductor region NLD1 (first semiconductor region) in the p well region PW (first well region) by ion implantation of phosphorus (first impurity), which is an n type (second conductivity type opposite to the first conductivity type) impurity, from the outside of the high-breakdown-voltage gate electrode HGN (first gate electrode) from a direction tilted by 45° with respect to a direction perpendicular to the main surface of the semiconductor substrate 1; a step of forming an offset spacer OS1 (first sidewall insulating film) on the side wall of each of the high-breakdown-voltage gate electrode HGN (first gate electrode) and the low-breakdown-voltage gate electrode LGN (second gate electrode); a step of forming a semiconductor region EXN (second semiconductor region) in the p well region PW (second well region) by ion implantation of arsenic (second impurity), which is an n type (second conductivity type) impurity, from the outside of the low-breakdown-voltage gate electrode LGN (second gate electrode) and the offset spacer OS1 (first sidewall insulating film); a step of forming a sidewall insulating film SW1 (second sidewall insulating film) on the offset spacer OS1 (first sidewall insulating film) of each of the high-breakdown-voltage gate electrode HGN (first gate electrode) and the low-breakdown-voltage gate electrode LGN (second gate electrode); a step of forming a semiconductor region NLD2 (third semiconductor region) in the p well region (first well region) by ion implantation of phosphorus (third impurity), which is an n type (second conductivity type) impurity, from the outside of the high-breakdown-voltage gate electrode HGN (first gate electrode), the offset spacer OS1 (first sidewall insulating film), and the sidewall insulating film SW1 (second sidewall insulating film) from a direction tilted by 45° with respect to a direction perpendicular to the main surface of the semiconductor substrate 1; a step of forming a sidewall insulating film SW2 (third sidewall insulating film) on the sidewall insulating film SW1 (second sidewall insulating film) in the HN region HNR (first region); a step of forming a semiconductor region NSD (fourth semiconductor region) in the p well region PW (first well region) by ion implantation of arsenic (fourth impurity), which is an n type (second conductivity type) impurity, from the outside of the high-breakdown-voltage gate electrode HGN (first gate electrode), the offset spacer OS1 (first sidewall insulating film), the sidewall insulating film SW1 (second sidewall insulating film), and the sidewall insulating film SW2 (third sidewall insulating film) from a direction perpendicular to the main surface of the semiconductor substrate 1; and a step of forming a silicide layer SL (silicide layer) on the surface of the semiconductor region NSD (fourth semiconductor region). The semiconductor region NLD1 (first semiconductor region), the semiconductor region NLD2 (third semiconductor region) and the semiconductor region NSD (fourth semiconductor region) constitute the first source region or the first drain region, while the semiconductor region EXN (second semiconductor region) constitutes the second source region or the second drain region. The impurity concentration of the semiconductor region NLD1 (first semiconductor region) is lower than that of the semiconductor region NLD2 (third semiconductor region) and the ion implantation energy of phosphorus (first impurity) is greater than that of phosphorus (third impurity).

In the method of manufacturing a semiconductor device according to the present embodiment, phosphorus (first impurity) for the formation of the semiconductor region NLD1 (first semiconductor region) is ion-implanted in the p well region PW (first well region) from a direction tilted by 45° with respect to a direction perpendicular to the main surface of the semiconductor substrate, while arsenic (second impurity) for the formation of the semiconductor region EXN (second semiconductor region) is ion-implanted in the p well region PW (second well region) from the outside of the offset spacer OS1 (first sidewall insulating film). As a result, overlapping width between the high-breakdown-voltage gate electrode HGN (first gate electrode) and the semiconductor region NLD1 can be increased and overlapping width between the low-breakdown-voltage gate electrode LGN (second gate electrode) and the semiconductor region EXN can be decreased. This leads to improvement in breakdown voltage of the high-breakdown-voltage n type transistor HTN (first transistor) between the source or drain region and the high-breakdown-voltage gate electrode HGN. Further, since the distance of the low-breakdown-voltage n type transistor LTN (second transistor) between the source region and the drain region can be increased (widened) to a level equivalent to the gate length of the low-breakdown-voltage gate electrode LGN, the low-breakdown-voltage n type transistor LTN can have a less short channel effect.

Further, arsenic (second impurity) for the formation of the semiconductor region EXN (second semiconductor region) is ion-implanted from a direction substantially perpendicular to the main surface of the semiconductor substrate so that the low-breakdown-voltage n type transistor LTN can have a further less short channel effect.

The high-breakdown-voltage n type transistor HTN and the low-breakdown-voltage n type transistor LTN have been described above as an example, but similar advantages can be achieved in the high-breakdown-voltage p type transistor HTP and the low-breakdown-voltage p type transistor LTP.

The invention made by the present inventors has been described specifically based on embodiments. The invention is however hot limited by the embodiments but can be changed variously without departing from the gist of the invention.

What is claimed is:

1. A method of producing a semiconductor device having a transistor equipped with a gate electrode, a source region, and a drain region, comprising the steps of:
   (a) providing a semiconductor substrate having a main surface,
   (b) forming a first conductivity type well in the semiconductor substrate,
   (c) forming the gate electrode over the main surface of the semiconductor substrate,
   (d) forming a first semiconductor region in the well region by ion implantation of a first impurity of a second conductivity type, which is a conductivity type opposite to the first conductivity type, from the outside of the gate electrode and from a direction tilted by 45° with respect to a direction perpendicular to the main surface of the semiconductor substrate,
   (e) forming a first sidewall insulating film over a side wall of the gate electrode,
   (f) forming a second semiconductor region in the well region by ion implantation of a second impurity of the second conductivity type from the outside of the gate electrode and the first sidewall insulating film and from a direction tilted by 45° with respect to a direction perpendicular to the main surface of the semiconductor substrate,
   (g) forming a second sidewall insulating film over the first sidewall insulating film,
   (h) forming a third semiconductor region in the well region by ion implantation of a third impurity of the second conductivity type from the outside of the gate electrode, the first sidewall insulating film, and the second sidewall insulating film and from a direction perpendicular to the main surface of the semiconductor substrate, and
   (i) forming a silicide layer over the surface of the third semiconductor region,
   wherein the first semiconductor region, the second semiconductor region, and the third semiconductor region forms the source region or the drain region,
   wherein the impurity concentration of the first semiconductor region is lower than the impurity concentration of the second semiconductor region, and
   wherein the ion implantation energy of the first impurity is greater than the ion implantation energy of the second impurity.

2. The method of manufacturing a semiconductor device according to claim 1,
   wherein the first impurity and the second impurity are each phosphorus.

3. The method of manufacturing a semiconductor device according to claim 2,
   wherein the third impurity is arsenic.

4. The method of manufacturing a semiconductor device according to claim 1,
   wherein the impurity concentration of the third semiconductor region is higher than the impurity concentration of the second semiconductor region.

5. The method of manufacturing a semiconductor device according to claim 1,
   wherein the ion implantation energy of the first impurity is greater than the ion implantation energy of the third impurity.

6. A method of manufacturing a semiconductor device having a first transistor equipped with a first gate electrode, a first source region, and a first drain region and a second transistor equipped with a second gate electrode, a second source region, and a second drain region, comprising the steps of:
   (a) providing a semiconductor substrate having, in the main surface thereof, a first region for forming therein the first transistor and a second region for forming therein the second transistor;
   (b) forming a first well region of a first conductivity type in the semiconductor substrate in the first region and forming a second well region of the first conductivity type in the semiconductor substrate in the second region;

(c) forming a first gate insulating film over the main surface of the semiconductor substrate in the first region and forming a second gate insulating film over the main surface of the semiconductor substrate in the second region;

(d) forming the first gate electrode over the first gate insulating film and forming the second gate electrode over the second gate insulating film;

(e) forming a first semiconductor region in the first well by ion implantation of a first impurity of a second conductivity type, which is a conductivity type opposite to the first conductivity type, from the outside of the first gate electrode and from a direction tilted by 45° with respect to a direction perpendicular to the main surface of the semiconductor substrate;

(f) forming a first sidewall insulating film over the side wall of each of the first gate electrode and the second gate electrode;

(g) forming a second semiconductor region in the second well region by ion implantation of a second impurity of the second conductivity type from the outside the second gate electrode and the first sidewall insulating film;

(h) forming a second sidewall insulating film over the first sidewall insulating film of each of the first gate electrode and the second gate electrode;

(i) forming a third semiconductor region in the first well region by ion implantation of a third impurity of the second conductivity type from the outside of the first gate electrode, the first sidewall insulating film, and the second sidewall insulating film and from a direction tilted by 45° with respect to a direction perpendicular to the main surface of the semiconductor substrate;

(j) forming a third sidewall insulating film over the second sidewall insulating film in the first region;

(k) forming a fourth semiconductor region in the first well region by ion implantation of a fourth impurity of the second conductivity type from the outside of the first gate electrode, the first sidewall insulating film, the second sidewall insulating film, and the third sidewall insulating film and from a direction perpendicular to the main surface of the semiconductor substrate; and (l) forming a silicide layer over the surface of the fourth semiconductor region, wherein the first semiconductor region, the third semiconductor region, and the fourth semiconductor region form the first source region or the first drain region, wherein the second semiconductor region forms the second source region or the second drain region;

wherein the impurity concentration of the first semiconductor region is lower than the impurity concentration of the third semiconductor region, and wherein the ion implantation energy of the first impurity is greater than the ion implantation energy of the third impurity.

7. The method of manufacturing a semiconductor device according to claim 6,
wherein the thickness of the first gate insulating film is greater than the thickness of the second gate insulating film.

8. The method of manufacturing a semiconductor device according to claim 6,
wherein the ion implantation energy of the first impurity is greater than the implantation energy of the second impurity.

9. The method of manufacturing a semiconductor device according to claim 8,
wherein the second impurity is ion-implanted from a direction perpendicular to the main surface of the semiconductor substrate.

10. The method of manufacturing a semiconductor device according to claim 6,
wherein the impurity concentration of the second semiconductor region is higher than the impurity concentration of each of the first semiconductor region and the third semiconductor region.

11. The method of manufacturing a semiconductor device according to claim 6,
wherein the width of the first sidewall insulating film is smaller than the width of the second sidewall insulating film.

12. The method of manufacturing a semiconductor device according to claim 6, further comprising between the step (h) and the step (i):
(m) removing the second sidewall insulating film from the second region,
wherein in the step (j), the third sidewall insulating film is formed over the side wall of the second gate electrode in the second region; and
wherein in the step (k), in the second region, a fifth semiconductor region is formed by ion implantation of the fourth impurity in the second well region from the outside of the second gate electrode, the first sidewall insulating film, and the third sidewall insulating film in the second region.

13. The method of manufacturing a semiconductor device according to claim 12,
wherein the second semiconductor region and the fifth semiconductor region form the second source region or the second drain region.

14. The method of manufacturing a semiconductor device according to claim 6, further comprising between the step (h) and the step (j):
(n) forming, in the first region, a sixth semiconductor region by ion implantation of a fifth impurity of the second conductivity type in the first well region from the outside of the first gate electrode, the first sidewall insulating film, and the second sidewall insulating film,
wherein the fifth impurity is ion-implanted from a direction perpendicular to the main surface of the semiconductor substrate.

15. The method of manufacturing a semiconductor device according to claim 14,
wherein the impurity concentration of the sixth semiconductor region is higher than the impurity concentration of the third semiconductor region.

* * * * *